United States Patent
Diep et al.

(10) Patent No.: US 10,068,651 B1
(45) Date of Patent: Sep. 4, 2018

(54) CHANNEL PRE-CHARGE TO SUPPRESS DISTURB OF SELECT GATE TRANSISTORS DURING ERASE IN MEMORY

(71) Applicant: SanDisk Technologies LLC, Plano, TX (US)

(72) Inventors: Vinh Diep, San Jose, CA (US); Wei Zhao, Fremont, CA (US); Ashish Baraskar, Santa Clara, CA (US); Ching-Huang Lu, Fremont, CA (US); Yingda Dong, San Jose, CA (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 15/621,215

(22) Filed: Jun. 13, 2017

(51) Int. Cl.
  *G11C 16/14* (2006.01)
  *G11C 16/24* (2006.01)
  *G11C 16/04* (2006.01)

(52) U.S. Cl.
  CPC .......... *G11C 16/24* (2013.01); *G11C 16/0483* (2013.01); *G11C 16/14* (2013.01)

(58) Field of Classification Search
  CPC .................................................... G11C 16/14
  USPC ....................................................... 365/218
  See application file for complete search history.

(56) References Cited

U.S. PATENT DOCUMENTS

| 7,903,462 B1 * | 3/2011 | Yeung | G11C 11/5635 365/185.11 |
|---|---|---|---|
| 9,019,775 B2 | 4/2015 | Costa et al. | |
| 9,136,005 B2 | 9/2015 | Choe et al. | |
| 9,142,305 B2 | 9/2015 | Dunga et al. | |
| 9,343,159 B2 | 5/2016 | Dong et al. | |
| 9,343,171 B1 | 5/2016 | Sun et al. | |
| 2011/0149659 A1 | 6/2011 | Goda et al. | |
| 2012/0033504 A1 | 2/2012 | Sarin et al. | |
| 2012/0201082 A1 | 8/2012 | Choy et al. | |
| 2012/0243321 A1 * | 9/2012 | Shinagawa | G11C 16/0483 365/185.18 |
| 2012/0327721 A1 | 12/2012 | Huang et al. | |
| 2013/0223143 A1 * | 8/2013 | Cho | G11C 16/0483 365/185.03 |

(Continued)

OTHER PUBLICATIONS

U.S. Appl. No. 15/403,710, filed Jan. 11, 2017, by Zhang et al.

(Continued)

*Primary Examiner* — Min Huang
(74) *Attorney, Agent, or Firm* — Vierra Magen Marcus LLP

(57) ABSTRACT

A memory device and associated techniques avoid a disturb of a select gate transistor during an erase operation. A pre-charge operation occurs in which a channel voltage is increased to a positive level. This reduces a channel gradient which can lead to a disturb of the select gate transistors. One approach involves applying a voltage at an intermediate level to the source and/or drain ends of the memory strings, before increasing the voltage from the intermediate level to a peak erase level. Another approach involves driving the word line voltages at a negative level and then at a higher level to down couple and then up couple the channel voltages. The techniques may be adjusted depending on whether the word lines are at a positive floating voltage at a start of the erase operation, and based on a level of the floating voltage.

19 Claims, 23 Drawing Sheets

(56) References Cited

U.S. PATENT DOCUMENTS

| | | | |
|---|---|---|---|
| 2013/0314995 A1* | 11/2013 | Dutta | G11C 7/1006 365/185.17 |
| 2014/0085981 A1* | 3/2014 | Takeuchi | G11C 16/10 365/185.12 |
| 2014/0112075 A1 | 4/2014 | Dunga et al. | |
| 2015/0179271 A1* | 6/2015 | Nam | G11C 16/16 365/218 |
| 2016/0133330 A1* | 5/2016 | Choe | G11C 16/14 365/185.29 |

OTHER PUBLICATIONS

International Search Report & the Written Opinion of the International Searching Authority dated Jun. 12, 2018, International Application No. PCT/US2018/021274.

* cited by examiner

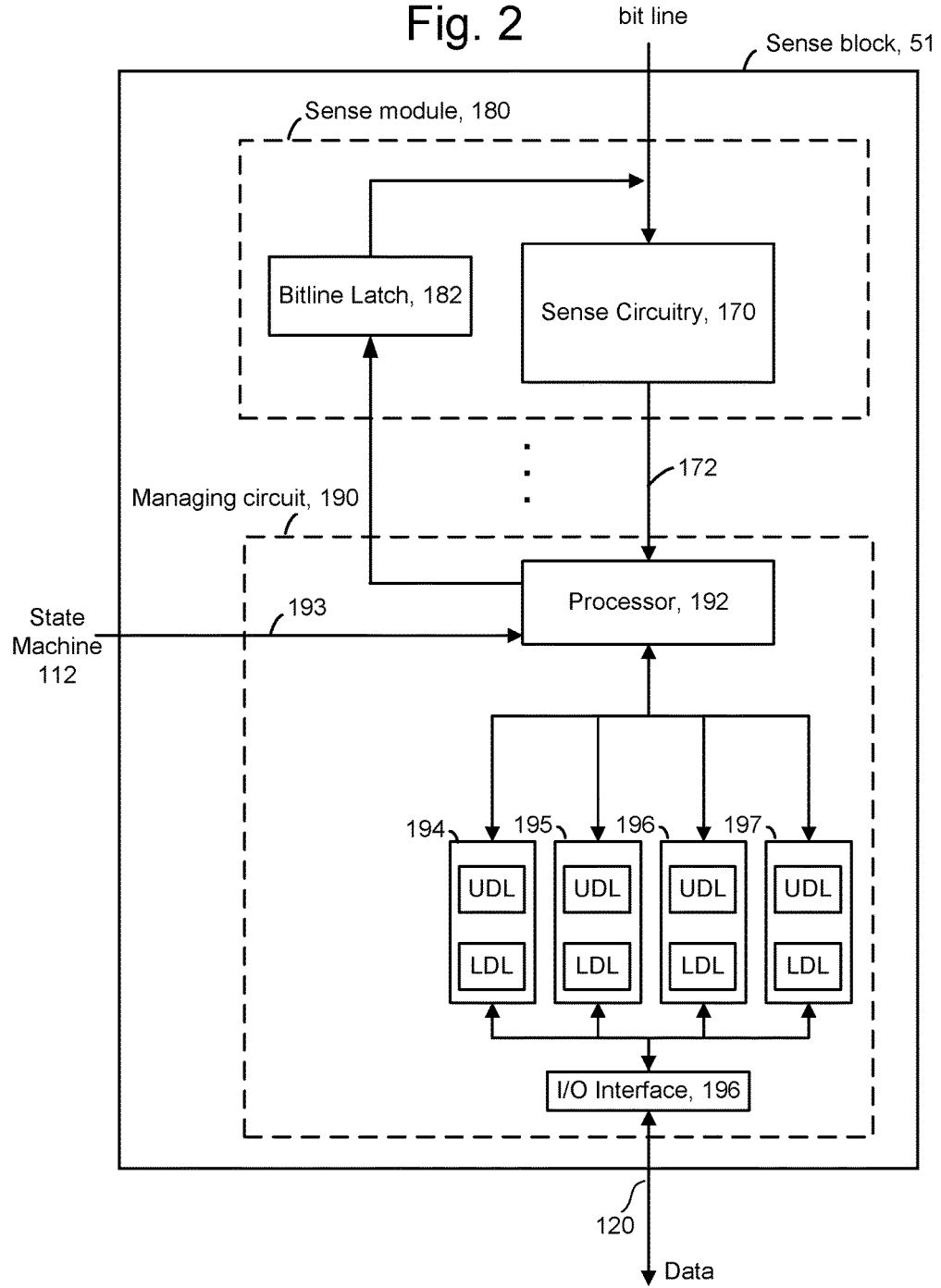

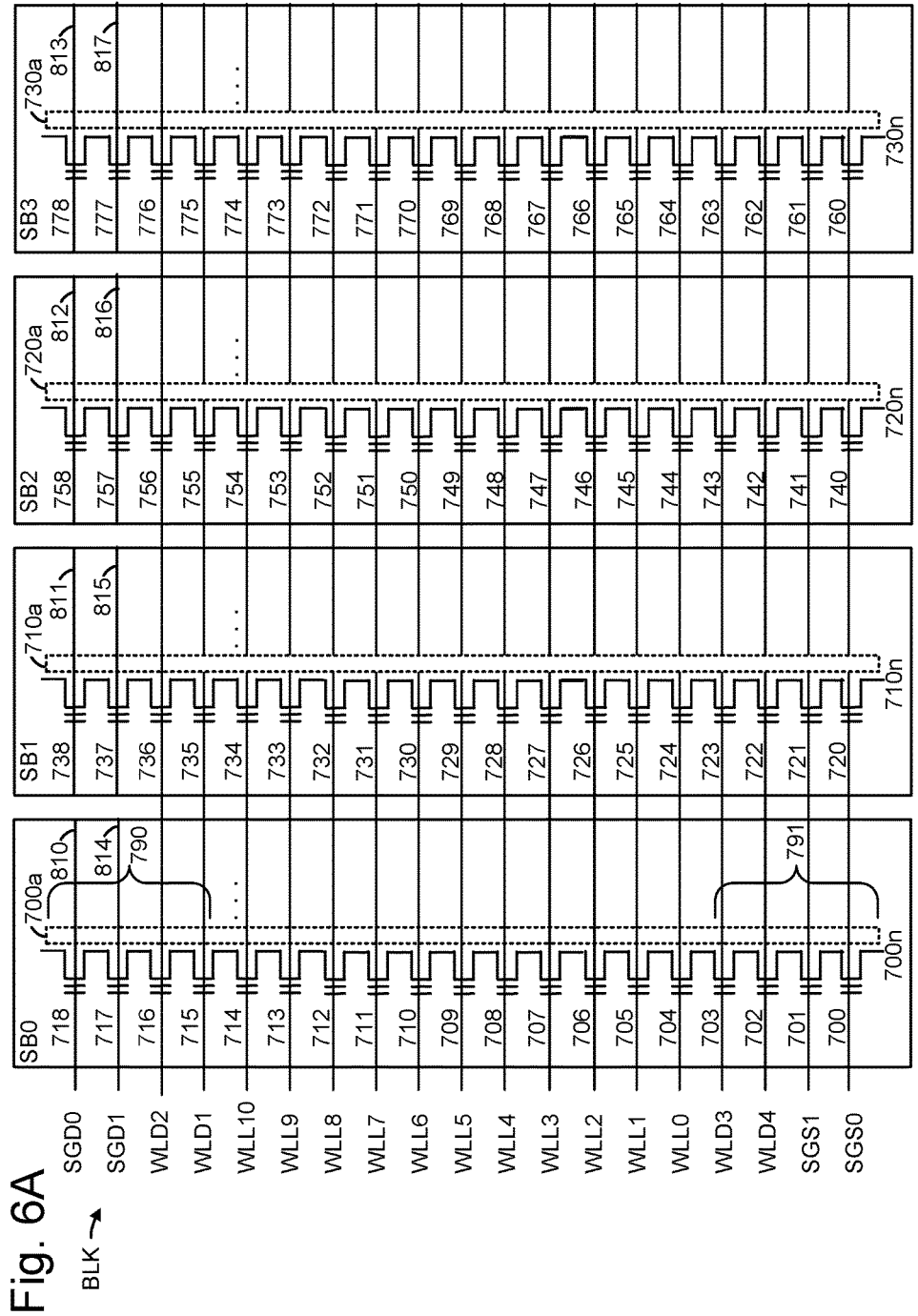

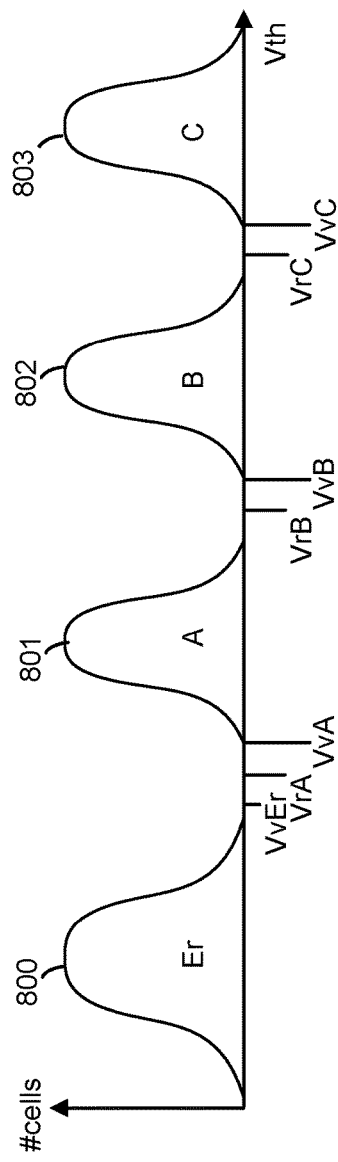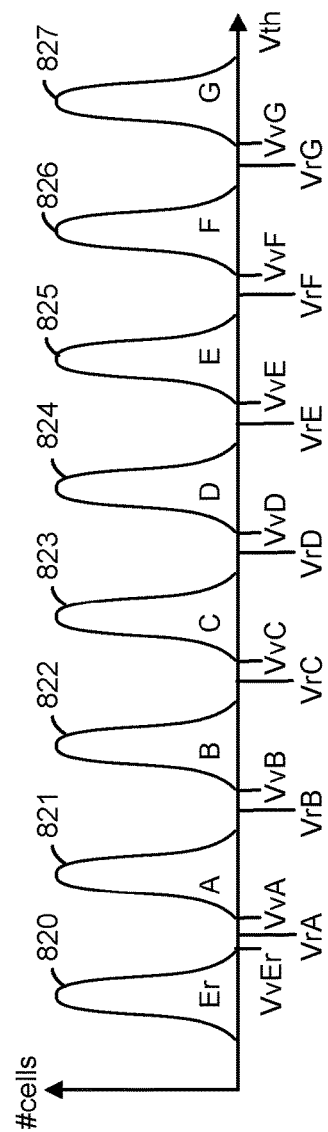

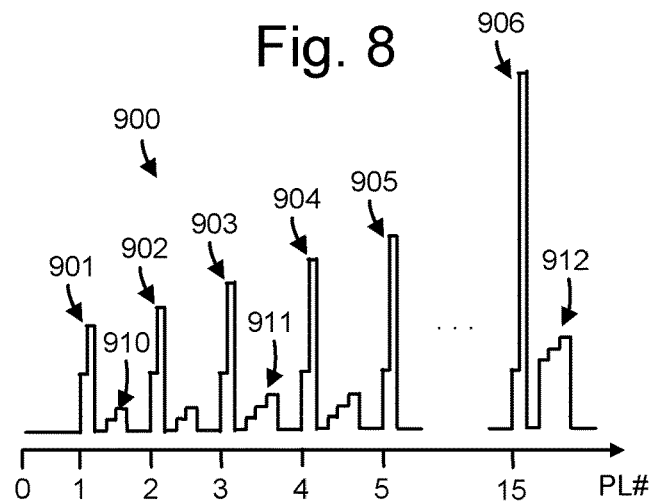
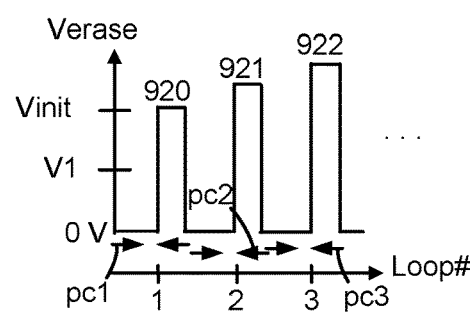
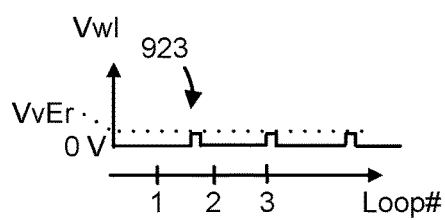

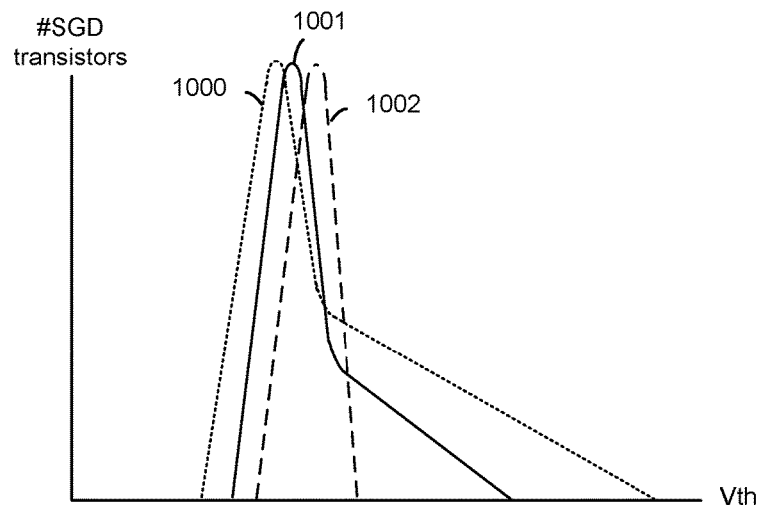
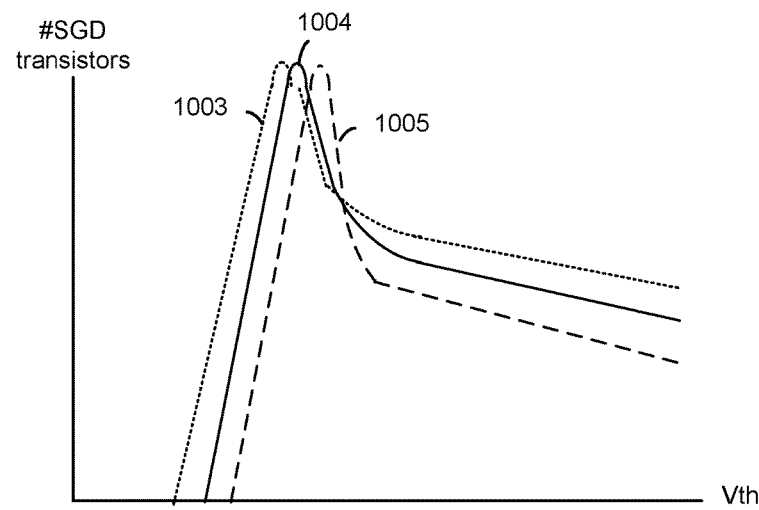

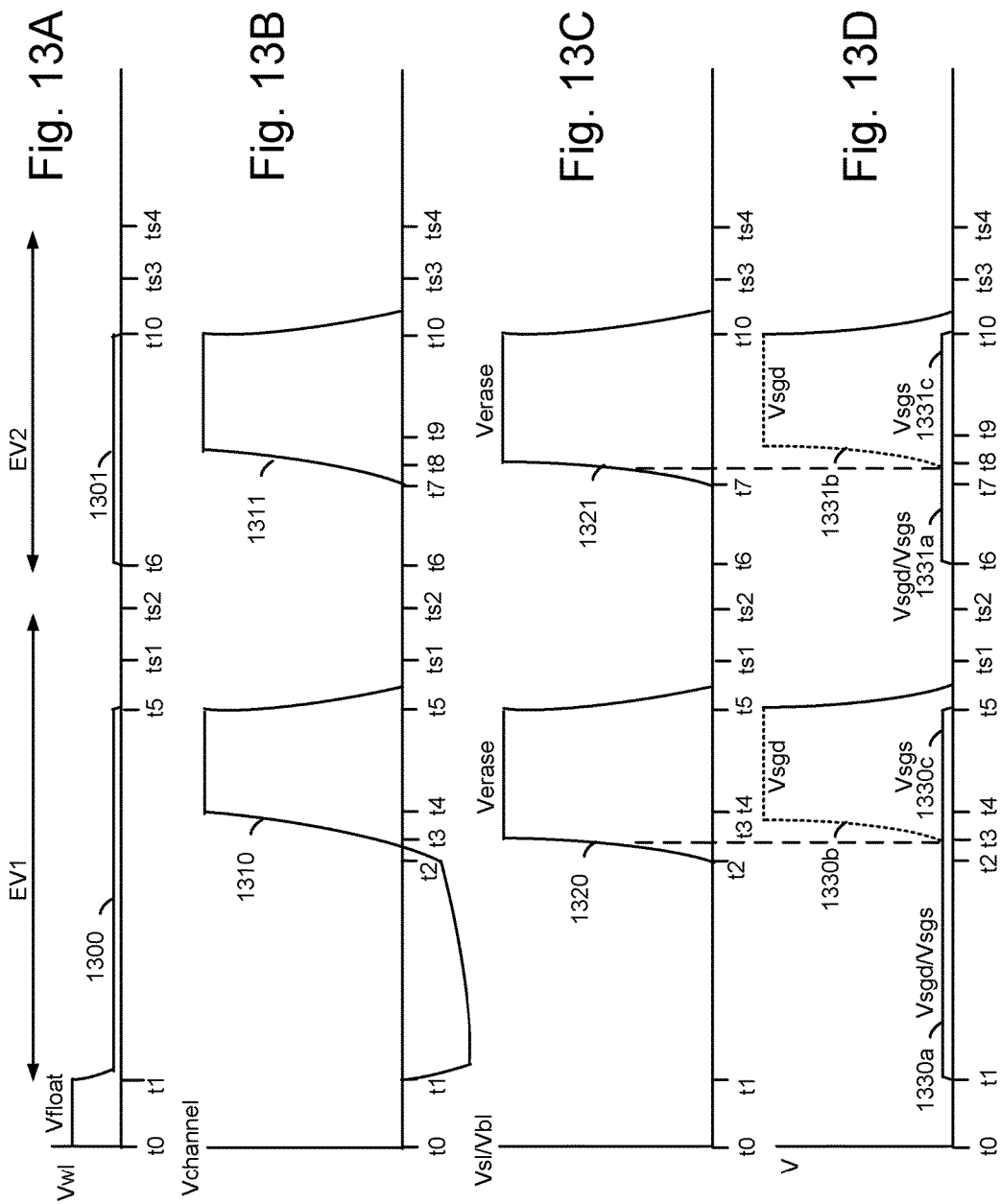

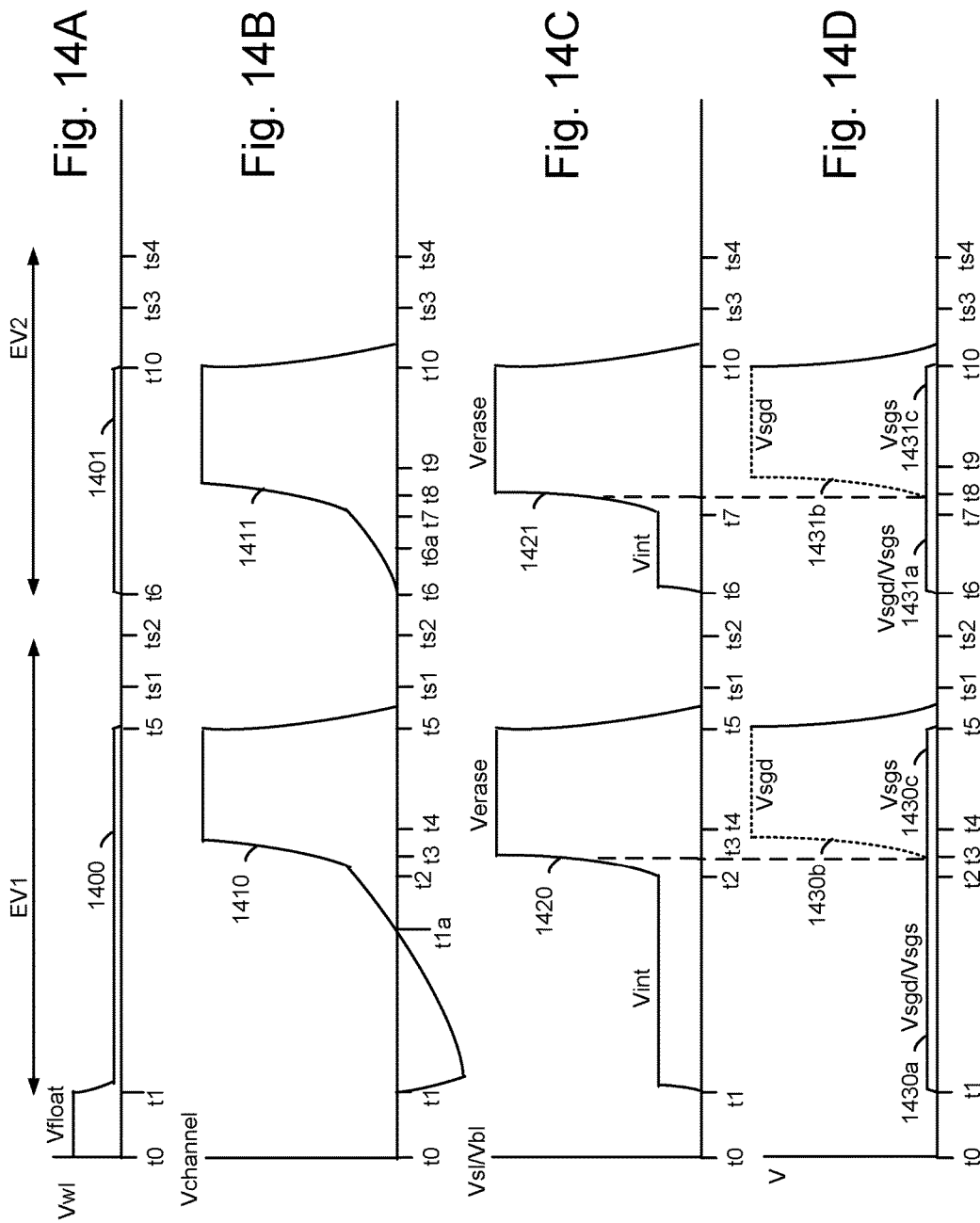

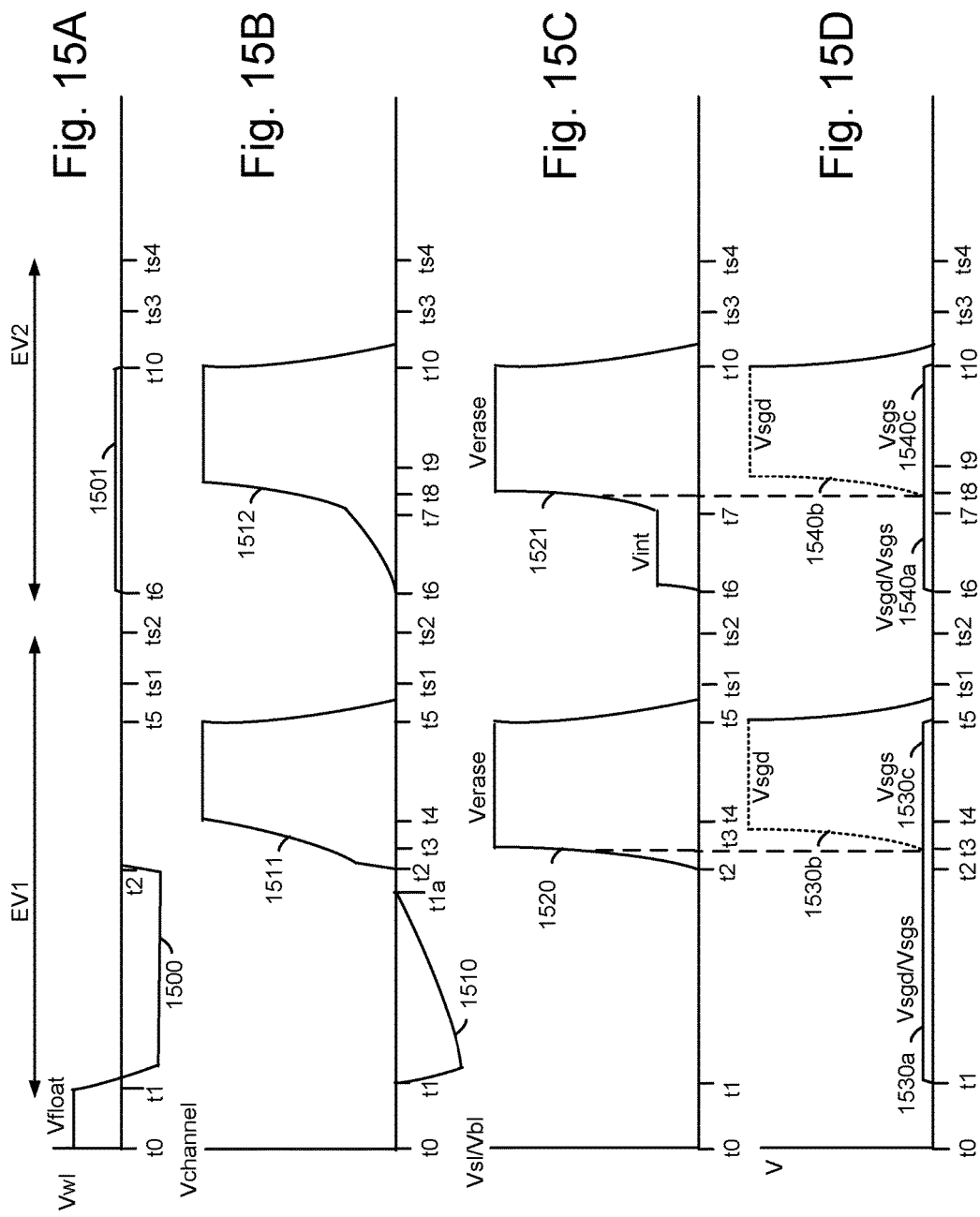

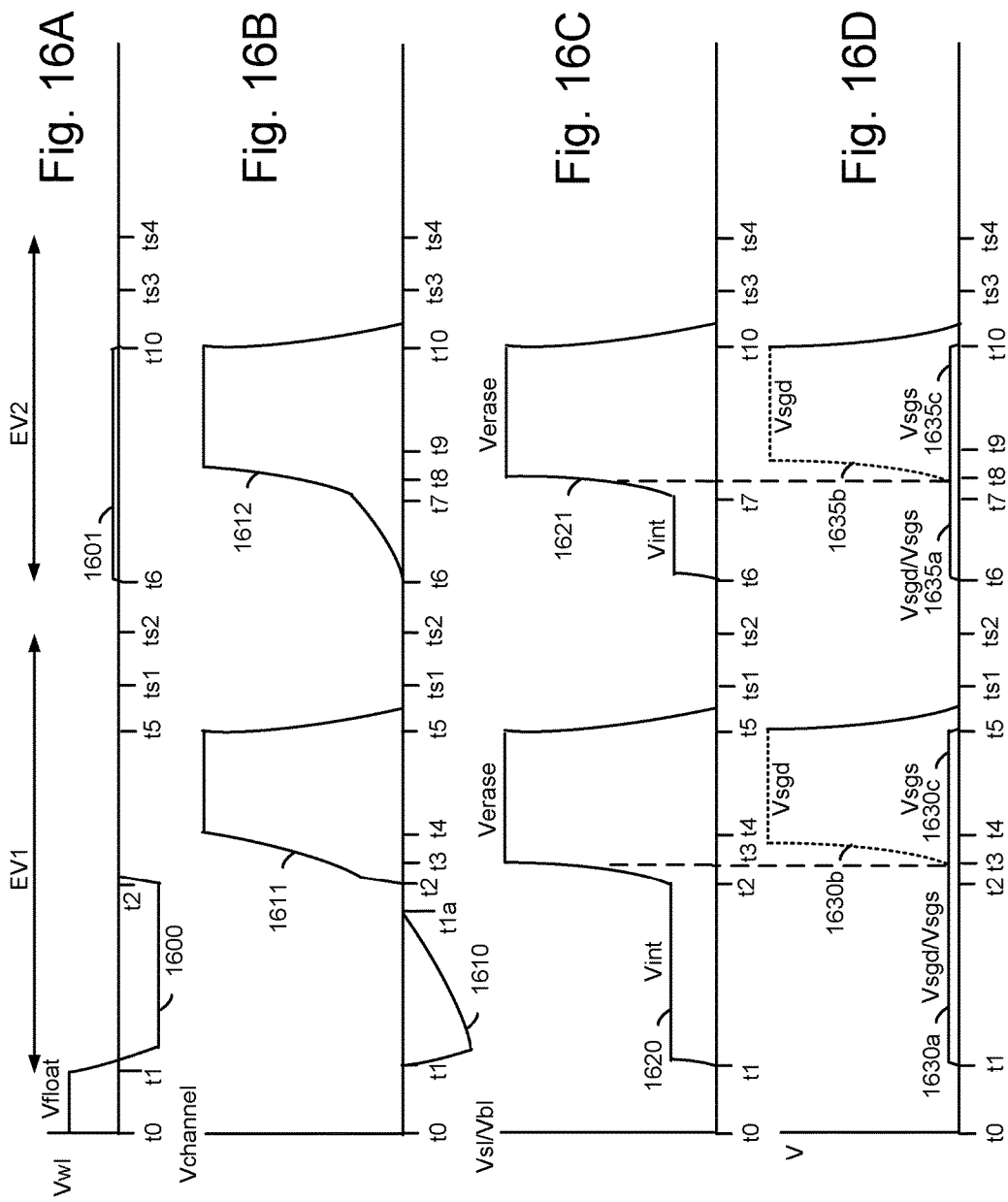

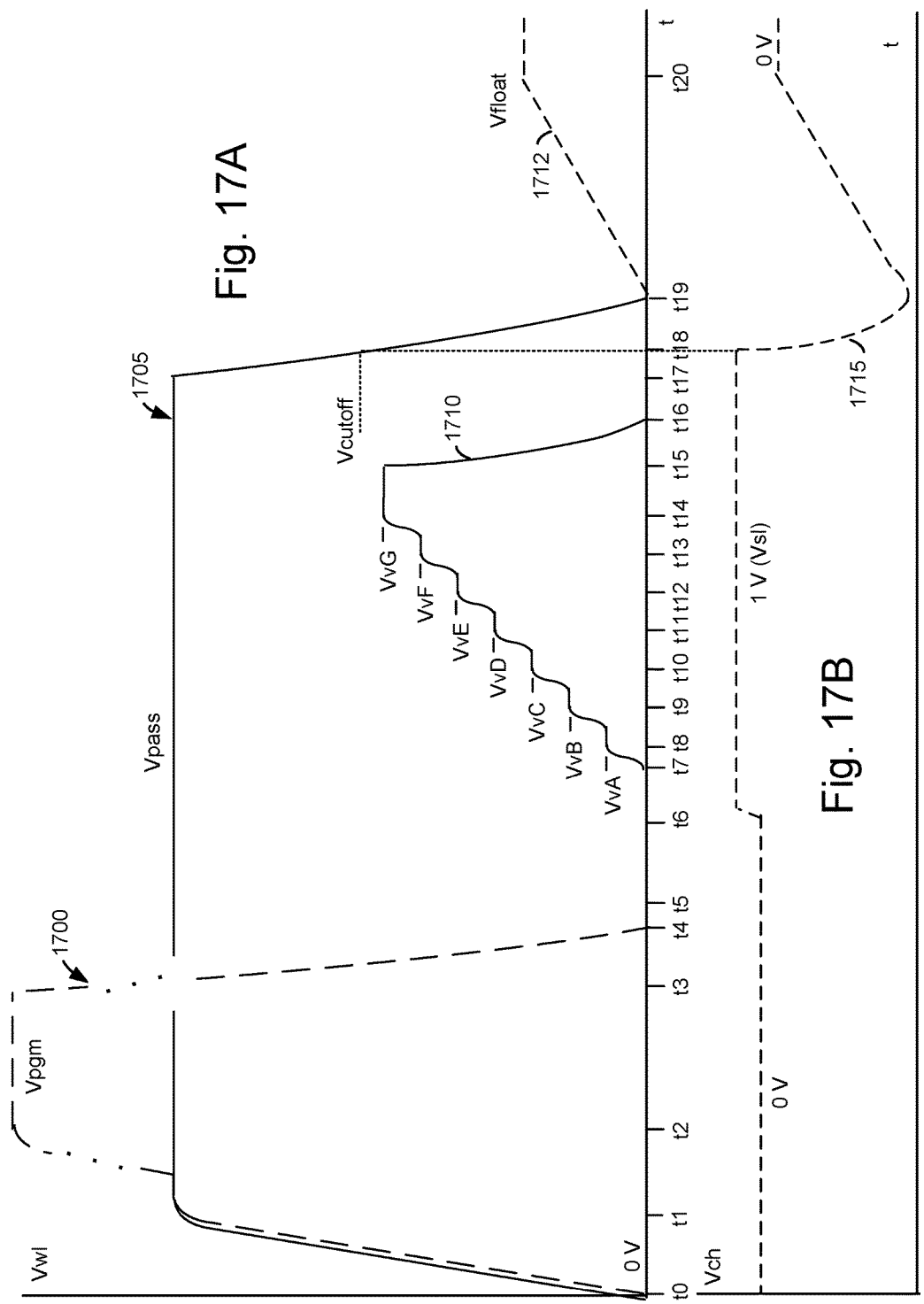

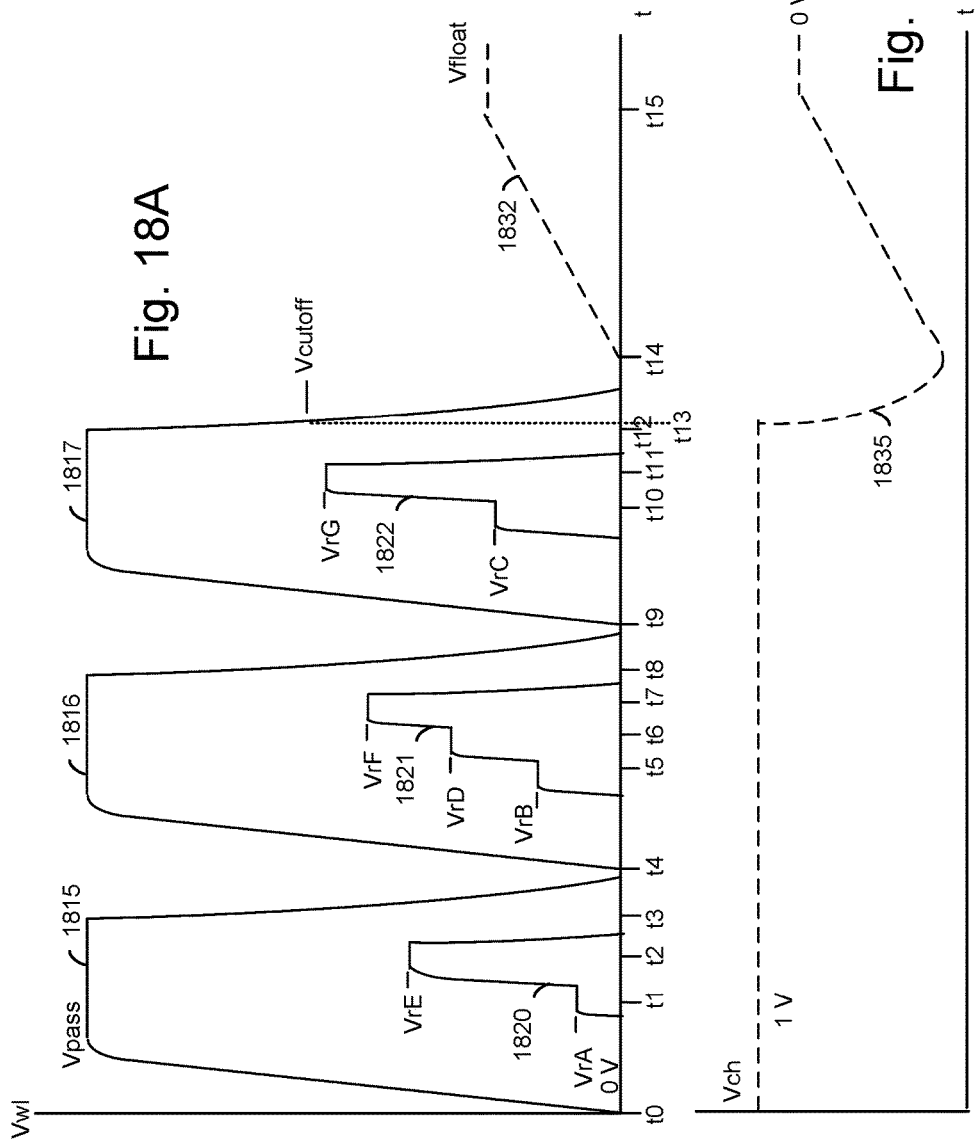

CHANNEL PRE-CHARGE TO SUPPRESS DISTURB OF SELECT GATE TRANSISTORS DURING ERASE IN MEMORY

BACKGROUND

The present technology relates to the operation of memory devices.

Semiconductor memory devices have become more popular for use in various electronic devices. For example, non-volatile semiconductor memory is used in cellular telephones, digital cameras, personal digital assistants, mobile computing devices, non-mobile computing devices and other devices.

A charge-storing material such as a floating gate or a charge-trapping material can be used in such memory devices to store a charge which represents a data state. A charge-trapping material can be arranged vertically in a three-dimensional (3D) stacked memory structure, or horizontally in a two-dimensional (2D) memory structure. One example of a 3D memory structure is the Bit Cost Scalable (BiCS) architecture which comprises a stack of alternating conductive and dielectric layers.

A memory device includes memory cells which may be arranged in strings, for instance, where select gate transistors are provided at the ends of the string to selectively connect a channel of the string to a source line or bit line. However, various challenges are presented in operating such memory devices.

BRIEF DESCRIPTION OF THE DRAWINGS

FIG. 2 is a block diagram depicting one embodiment of a sense block 51-53 of FIG. 1A.

FIG. 6A depicts an example implementation of the memory structure 126 of FIG. 1A comprising NAND strings in sub-blocks in a 3D configuration.

FIG. 7A depicts an example threshold voltage (Vth) distribution of a set of memory cells, where four data states are used.

FIG. 7B depicts an example Vth distribution of a set of memory cells, where eight data states are used.

FIG. 8 depicts a waveform of an example programming operation.

FIG. 9A depicts a plot of erase voltages in an example erase operation.

FIG. 9B depicts a plot of erase-verify voltages applied to word lines in a block, consistent with the example of FIG. 9A.

FIG. 10A depicts a plot of a number of SGD transistors versus Vth, for a fresh block of memory cells, and for different temperatures.

FIG. 10B depicts a plot of a number of SGD transistors versus Vth, for a cycled block of memory cells, and for different temperatures.

FIG. 13A to 13D depict voltages in one example of an erase operation, where a channel voltage (Vchannel) is down coupled and does not have time to recover to 0 V, resulting in SGD transistor disturb, and where FIG. 13A depicts a word line voltage (Vwl), FIG. 13B depicts Vchannel, FIG. 13C depicts a source line voltage (Vsl) and a bit line voltage (Vbl), and FIG. 13D depicts a drain side select gate voltage (Vsgd) and a source side select gate voltage (Vsgs).

FIG. 14A to 14D depict voltages in one example of an erase operation consistent with the process of FIG. 12C, where FIG. 14A depicts Vwl, FIG. 14B depicts Vchannel, FIG. 14C depicts Vsl and Vbl, and FIG. 14D depicts Vsgd and Vsgs.

FIG. 15A to 15D depict voltages in one example of an erase operation consistent with the process of FIG. 12D, where FIG. 15A depicts Vwl, FIG. 15B depicts Vchannel, FIG. 15C depicts Vsl and Vbl, and FIG. 15D depicts Vsgd and Vsgs.

FIG. 16A to 16D depict voltages in one example of an erase operation consistent with the processes of FIGS. 12C and 12D, where FIG. 16A depicts Vwl, FIG. 16B depicts Vchannel, FIG. 16C depicts Vsl and Vbl, and FIG. 16D depicts Vsgd and Vsgs.

FIG. 17A depicts a plot of example waveforms in a programming operation, showing coupling up of a word line voltage.

FIG. 17B depicts a plot of a channel voltage (Vch) corresponding to FIG. 17A.

FIG. 18A depicts a plot of example waveforms in a read operation, showing coupling up of a word line voltage.

FIG. 18B depicts a plot of a channel voltage (Vch) corresponding to FIG. 18A.

DETAILED DESCRIPTION

Figure 1A:
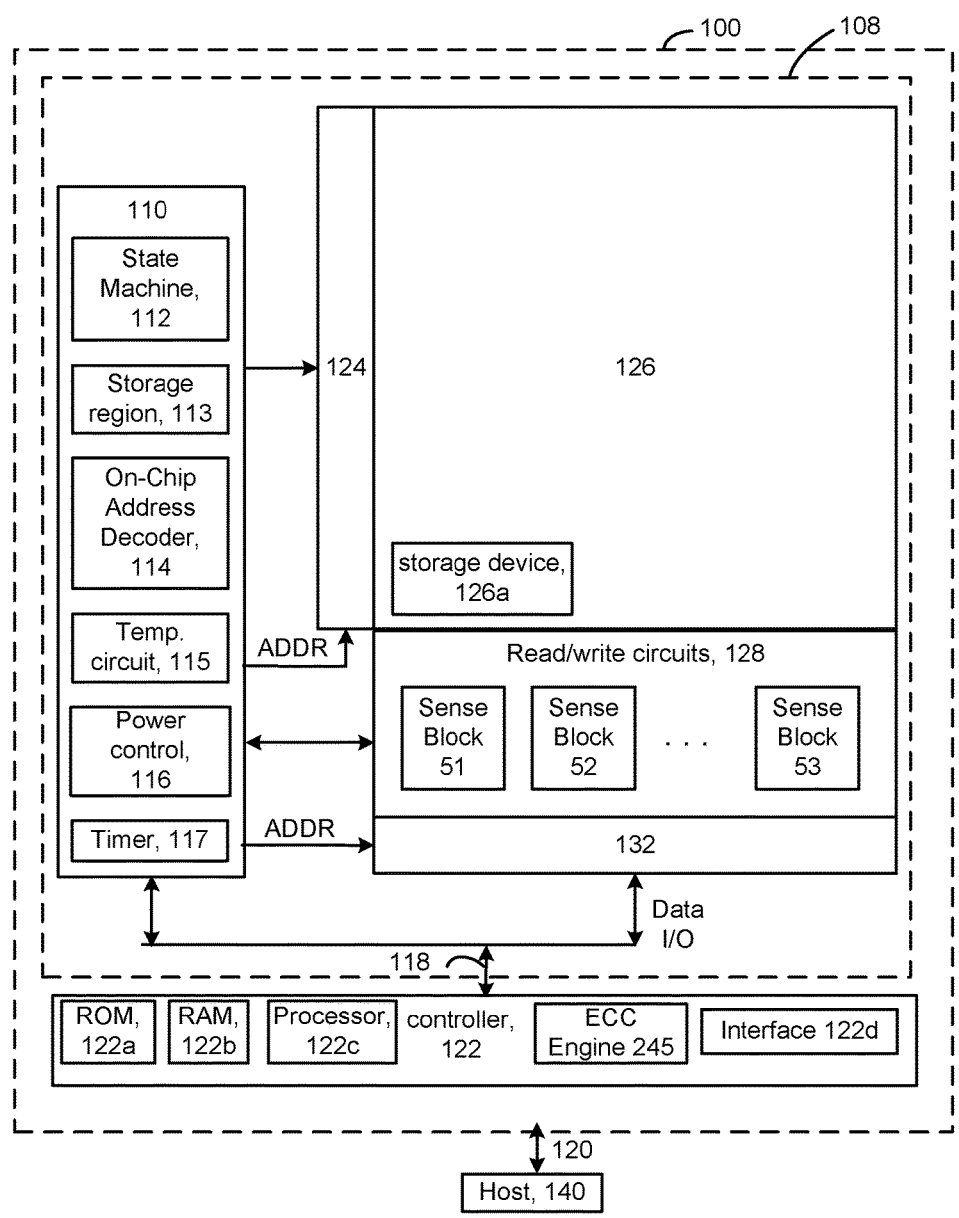
FIG. 1A is a block diagram of an example memory device.

Apparatuses and techniques are described for avoiding disturbs of select gate transistors during an erase operation for a block of memory cells.

In some memory devices, memory cells are joined to one another such as in NAND strings in a block or sub-block. Each NAND string comprises a number of memory cells connected in series between one or more drain-side SG transistors (SGD transistors), on a drain-side of the NAND string which is connected to a bit line, and one or more source-side SG transistors (SGS transistors), on a source-side of the NAND string which is connected to a source line. Further, the memory cells can be arranged with a common control gate line (e.g., word line) which acts a control gate. A set of word lines extends from the source side of a block to the drain side of a block. Memory cells can be connected in other types of strings and in other ways as well.

In a 3D memory structure, the memory cells may be arranged in vertical strings in a stack, where the stack comprises alternating conductive and dielectric layers. The conductive layers act as word lines which are connected to the memory cells.

The memory cells can include data memory cells, which are eligible to store user data, and dummy or non-data memory cells which are ineligible to store user data. A dummy word line is connected to a dummy memory cell. One or more dummy memory cells may be provided at the drain and/or source ends of a string of memory cells to provide a gradual transition in the channel voltage gradient.

During a programming operation, the memory cells are programmed according to a word line programming order. For example, the programming may start at the word line at the source side of the block and proceed to the word line at the drain side of the block. In one approach, each word line is completely programmed before programming a next word line. For example, a first word line, WL0, is programmed using one or more programming passes until the programming is completed. Next, a second word line, WL1, is programmed using one or more programming passes until the programming is completed, and so forth. A programming pass may include a set of increasing program voltages which are applied to the word line in respective program loops or program-verify iterations. Verify operations may be performed after each program voltage to determine whether the memory cells have completed programming. When programming is completed for a memory cell, it can be locked out from further programming while programming continues for other memory cells in subsequent program loops.

The memory cells may also be programmed according to a sub-block programming order, where memory cells in one sub-block, or portion of a block, are programmed before programming memory cells in another sub-block.

Each memory cell may be associated with a data state according to write data in a program command. Based on its data state, a memory cell will either remain in the erased state or be programmed to a programmed data state. For example, in a one bit per cell memory device, there are two data states including the erased state and the programmed state. In a two-bit per cell memory device, there are four data states including the erased state and three higher data states referred to as the A, B and C data states (see FIG. 7A). In a three-bit per cell memory device, there are eight data states including the erased state and seven higher data states referred to as the A, B, C, D, E, F and G data states (FIG. 7B). In a four-bit per cell memory device, there are sixteen data states including the erased state and fifteen higher data states.

After the memory cells are programmed, the data can be read back in a read operation. A read operation can involve applying a series of read voltages to a word line while sensing circuitry determines whether cells connected to the word line are in a conductive or non-conductive state. If a cell is in a non-conductive state, the Vth of the memory cell exceeds the read voltage. The read voltages are set at levels which are expected to be between the threshold voltage levels of adjacent data states.

When new data is to be written to a block, the block is erased. This involves boosting the channel voltage while holding the control gates of the memory cells at a low voltage such as 0-0.5 V. Various approaches can be used to boost the channel voltage. One approach raises the voltage of a substrate at a source end of the memory strings. Additionally, the control gate voltage of a source side select gate transistor (SGS transistor) of each memory string is controlled to allow holes (positive charges) to enter the channel. The substrate is the primary source of holes to charge up the channel. A voltage can also be applied to the drain ends of the memory strings via bit lines, to help boost the channel voltage.

However, the voltage on the bit lines typically increases to the requested level quickly due to the metal composition of the bit lines and the corresponding low resistance. On the other hand, the substrate voltage increases more slowly due to the large capacitance of the substrate. Moreover, it takes some time for the drain end of the channel to be charged up by the holes which are passed from the substrate into the source end of the channel. As a result, a channel gradient can be generated near the SGD transistors. The channel gradient can generate electron-hole pairs in which the electrons are drawn into the charge trapping layer near the SGD transistors, raising the threshold voltage of these transistors. See FIGS. 10A and 10B. This is a type of disturb.

In some cases, the disturb is worsened by a down coupling of the channel which occurs when the word lines are driven in the erase operation.

Techniques provided herein address the above and other issues. In one aspect, a channel gradient near the SGD transistors is reduced by increasing the channel voltage on a source side of the SGD transistors to a positive level before the peak erase voltage is applied on the bit line. One approach involves applying a voltage at an intermediate level to the source and/or drain ends of the memory strings, before increasing the voltage from the intermediate level to a peak erase level. The voltage at the intermediate level helps charge up the channel. Another approach involves driving the word line voltages at a negative level and then at a higher level to down couple and then up couple the channel voltages. The down coupling can increase the arte of hole generation to more quickly charge up the channel.

The techniques may be adjusted depending on whether the word lines are at a positive floating voltage at a start of the erase operation, and based on a level of the floating voltage. In some cases, the disturb countermeasures are performed for the first program-verify iteration in an erase operation but not for subsequent program-verify iterations in the erase operation. Or, the disturb countermeasures are performed for the subsequent program-verify iterations but to a less extent than for the first program-verify iteration.

These and other features are discussed herein.

FIG. 1A is a block diagram of an example memory device. The memory device 100, such as a non-volatile storage system, may include one or more memory die 108. The memory die 108 includes a memory structure 126 of memory cells, such as an array of memory cells, control circuitry 110, and read/write circuits 128. The memory structure 126 is addressable by word lines via a row decoder 124 and by bit lines via a column decoder 132. The read/write circuits 128 include multiple sense blocks 51, 52, . . . , 53 (sensing circuitry) and allow a page of memory cells to be read or programmed in parallel. Typically a controller 122 is included in the same memory device 100 (e.g., a removable storage card) as the one or more memory die 108. The controller may be separate from the memory die. Commands and data are transferred between the host 140 and controller 122 via a data bus 120, and between the controller and the one or more memory die 108 via lines 118.

The memory structure can be 2D or 3D. The memory structure may comprise one or more array of memory cells including a 3D array. The memory structure may comprise a monolithic 3D memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine 112, an on-chip address decoder 114, a temperature-sensing circuit 115, a power control module 116 and a timer 117. The state machine 112 provides chip-level control of memory operations. A storage region 113 may be provided, e.g., for operational parameters and software/code. In one embodiment, the state machine is programmable by the software. In other embodiments, the state machine does not use software and is completely implemented in hardware (e.g., electrical circuits).

The on-chip address decoder 114 provides an address interface between that used by the host or a memory controller to the hardware address used by the decoders 124 and 132. The temperature-sensing circuit may detect a temperature of the memory device. See FIG. 1B for further details of a temperature-sensing circuit.

The power control module 116 controls the power and voltages supplied to the word lines, select gate lines, bit lines and source lines during memory operations. It can include drivers for word lines, SGS and SGD transistors and source lines. The sense blocks can include bit line drivers, in one approach. An SGS transistor is a select gate transistor at a source end or source side of a NAND string, and an SGD transistor is a select gate transistor at a drain-end or drain side of a NAND string.

The timer 117 may be used for tracking an elapsed time since a last sensing operation for a block of memory cells. In one example, a sensing operation includes a read operation. In another example, a sensing operation includes a program operation, where the verify tests in the program operation are a form of sensing. The elapsed time is an indication of a floating level of the word lines of a block and can be used to adjust a pre-charge process of an erase operation as discussed further below.

In some implementations, some of the components can be combined. In various designs, one or more of the components (alone or in combination), other than memory structure 126, can be thought of as at least one control circuit which is configured to perform the techniques described herein including the steps of the processes described herein. For example, a control circuit may include any one of, or a combination of, control circuitry 110, state machine 112, decoders 114 and 132, power control module 116, sense blocks 51, 52, . . . , 53, read/write circuits 128, controller 122, and so forth.

The off-chip controller 122 (which in one embodiment is an electrical circuit) may comprise a processor 122c, storage devices (memory) such as ROM 122a and RAM 122b and an error-correction code (ECC) engine 245. The ECC engine can correct a number of read errors.

A memory interface 122d may also be provided. The memory interface, in communication with ROM, RAM and processor, is an electrical circuit that provides an electrical interface between controller and memory die. For example, the memory interface can change the format or timing of signals, provide a buffer, isolate from surges, latch I/O and so forth. The processor can issue commands to the control circuitry 110 (or any other component of the memory die) via the memory interface 122d.

The storage device comprises code such as a set of instructions, and the processor is operable to execute the set of instructions to provide the functionality described herein. Alternatively or additionally, the processor can access code from a storage device 126a of the memory structure, such as a reserved area of memory cells in one or more word lines.

For example, code can be used by the controller to access the memory structure such as for programming, read and erase operations. The code can include boot code and control code (e.g., a set of instructions). The boot code is software that initializes the controller during a booting or startup process and enables the controller to access the memory structure. The code can be used by the controller to control one or more memory structures. Upon being powered up, the processor 122c fetches the boot code from the ROM 122a or storage device 126a for execution, and the boot code initializes the system components and loads the control code into the RAM 122b. Once the control code is loaded into the RAM, it is executed by the processor. The control code includes drivers to perform basic tasks such as controlling and allocating memory, prioritizing the processing of instructions, and controlling input and output ports.

Generally, the control code can include instructions to perform the functions described herein including the steps of the flowcharts discussed further below, and provide the voltage waveforms including those discussed further below. A control circuit can be configured to execute the instructions to perform the functions described herein.

In one embodiment, the host is a computing device (e.g., laptop, desktop, smartphone, tablet, digital camera) that includes one or more processors, one or more processor readable storage devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and SG transistors.

A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three dimensions, such as a 2D memory structure or a 3D memory structure.

In a 2D memory structure, the semiconductor memory elements are arranged in a single plane or a single memory device level. Typically, in a 2D memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A 3D memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a 3D memory structure may be vertically arranged as a stack of multiple 2D memory device levels. As another non-limiting example, a 3D memory array may be arranged as multiple vertical columns (e.g., columns extending substantially perpendicular to the major surface of the substrate, i.e., in the y direction) with each column having multiple memory elements. The columns may be arranged in a 2D configuration, e.g., in an x-y plane, resulting in a 3D arrangement of memory elements with elements on multiple vertically stacked memory planes. Other configurations of memory elements in three dimensions can also constitute a 3D memory array.

By way of non-limiting example, in a 3D NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other 3D configurations can be envisioned wherein some NAND strings contain memory elements in a single memory level while other strings contain memory elements which span through multiple memory levels. 3D memory arrays may also be designed in a NOR configuration and in a ReRAM configuration.

Typically, in a monolithic 3D memory array, one or more memory device levels are formed above a single substrate. Optionally, the monolithic 3D memory array may also have one or more memory layers at least partially within the single substrate. As a non-limiting example, the substrate may include a semiconductor such as silicon. In a monolithic 3D array, the layers constituting each memory device level of the array are typically formed on the layers of the underlying memory device levels of the array. However, layers of adjacent memory device levels of a monolithic 3D memory array may be shared or have intervening layers between memory device levels.

2D arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic 3D memory arrays. Further, multiple 2D memory arrays or 3D memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the 2D and 3D exemplary structures described but covers all relevant memory structures within the spirit and scope of the technology as described herein and as understood by one of skill in the art.

Figure 1B:
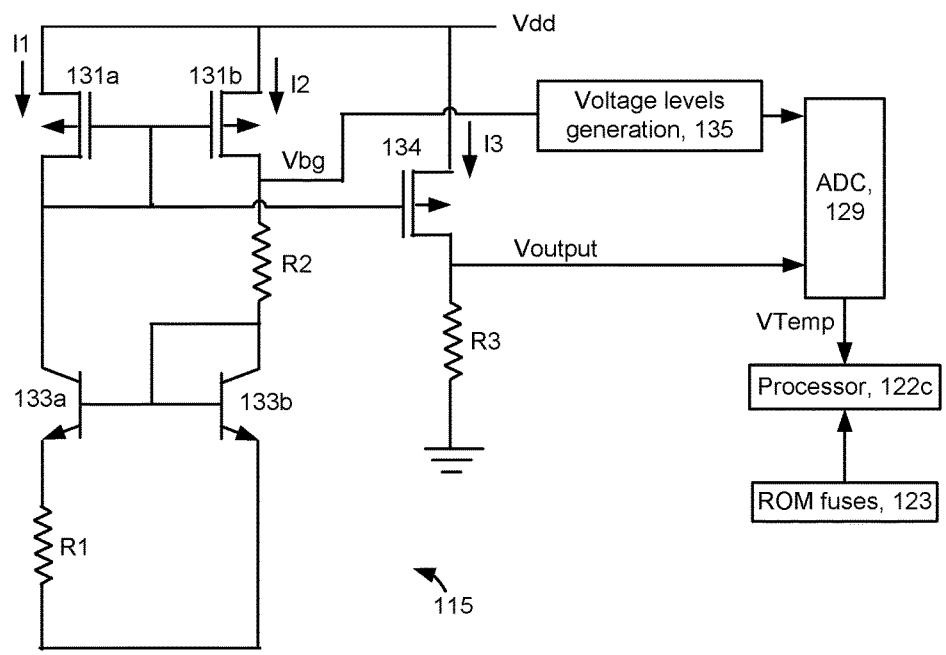
FIG. 1B depicts an example of the temperature-sensing circuit 115 of FIG. 1A.

FIG. 1B depicts an example of the temperature-sensing circuit 115 of FIG. 1A. The circuit includes pMOSFETs 131a, 131b and 134, bipolar transistors 133a and 133b and resistors R1, R2 and R3. I1, I2 and I3 denote currents. Voutput is a temperature-based output voltage provided to an analog-to-digital (ADC) converter 129. Vbg is a temperature-independent voltage. A voltage level generation circuit 135 uses Vbg to set a number of voltage levels. For example, a reference voltage may be divided down into several levels by a resistor divider circuit.

The ADC compares Voutput to the voltage levels and selects a closest match among the voltage levels, outputting a corresponding digital value (VTemp) to the processor. This is data indicating a temperature of the memory device. ROM fuses 123 store data which correlates the matching voltage level to a temperature, in one approach. The processor then uses the temperature to set temperature-based parameters in the memory device.

Vbg, is obtained by adding the base-emitter voltage (Vbe) across the transistor 131b and the voltage drop across the resistor R2. The bipolar transistor 133a has a larger area (by a factor N) than the transistor 133b. The PMOS transistors 131a and 131b are equal in size and are arranged in a current mirror configuration so that the currents I1 and I2 are substantially equal. We have Vbg=Vbe+R2×I2 and I1=Ve/R1 so that I2=Ve/R1. As a result, Vbg=Vbe+R2×kT ln(N)/R1×q, where T is temperature, k is Boltzmann's constant and q is a unit of electric charge. The source of the transistor 134 is connected to a supply voltage Vdd and the node between the transistor's drain and the resistor R3 is the output voltage, Voutput. The gate of the transistor 134 is connected to the same terminal as the gates of transistors 131a and 131b and the current through the transistor 134 mirrors the current through the transistors 131a and 131b.

FIG. 2 is a block diagram depicting one embodiment of a sense block 51-53 of FIG. 1A. An individual sense block 51 is partitioned into one or more core portions, referred to as sense modules 180 or sense amplifiers, and a common portion, referred to as a managing circuit 190. In one embodiment, there will be a separate sense module 180 for each bit line and one common managing circuit 190 for a set of multiple, e.g., four or eight, sense modules 180. Each of the sense modules in a group communicates with the associated managing circuit via data bus 172. Thus, there are one or more managing circuits which communicate with the sense modules of a set of storage elements.

Sense module 180 comprises sense circuitry 170 that performs sensing by determining whether a conduction current in a connected bit line is above or below a predetermined threshold level. Sense module 180 also includes a bit line latch 182 that is used to set a voltage condition on the connected bit line. For example, a predetermined state latched in bit line latch 182 will result in the connected bit line being pulled to a state designating program inhibit (e.g., 1.5-3 V). As an example, a flag=0 can inhibit programming, while flag=1 does not inhibit programming.

Managing circuit 190 comprises a processor 192, four example sets of data latches 194-197 and an I/O Interface 196 coupled between the set of data latches 194 and data bus 120. One set of data latches can be provide for each sense module, and data latches identified by LDL and UDL may be provided for each set. In some cases, additional data latches may be used. LDL stores a bit for a lower page of data, and UDL stores a bit for an upper page of data. This is in a four-level or two-bits per storage element memory device. One additional data latch per bit line can be provided for each additional data bit per storage element.

Processor 192 performs computations, such as to determine the data stored in the sensed storage element and store the determined data in the set of data latches. Each set of data latches 194-197 is used to store data bits determined by processor 192 during a read operation, and to store data bits imported from the data bus 120 during a programming operation which represent write data meant to be programmed into the memory. I/O interface 196 provides an interface between data latches 194-197 and the data bus 120.

During reading, the operation of the system is under the control of state machine 112 that controls the supply of different control gate voltages to the addressed storage element. As it steps through the various predefined control gate voltages corresponding to the various memory states supported by the memory, the sense module 180 may trip at one of these voltages and a corresponding output will be provided from sense module 180 to processor 192 via bus 172. At that point, processor 192 determines the resultant memory state by consideration of the tripping event(s) of the sense module and the information about the applied control gate voltage from the state machine via input lines 193. It then computes a binary encoding for the memory state and stores the resultant data bits into data latches 194-197. In another embodiment of the managing circuit 190, bit line latch 182 serves double duty, both as a latch for latching the output of the sense module 180 and also as a bit line latch as described above.

Some implementations can include multiple processors 192. In one embodiment, each processor 192 will include an output line (not depicted) such that each of the output lines is wired-OR'd together. In some embodiments, the output lines are inverted prior to being connected to the wired-OR line. This configuration enables a quick determination during the program verification process of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with eight sense modules, the state machine needs to read the wired-OR line eight times, or logic is added to processor 192 to accumulate the results of the associated bit lines such that the state machine need only read the wired-OR line one time. Similarly, by choosing the logic levels correctly, the global state machine can detect when the first bit changes its state and change the algorithms accordingly.

During program or verify operations, the data to be programmed (write data) is stored in the set of data latches 194-197 from the data bus 120, in the LDL and UDL latches, in a two-bit per storage element implementation. In a three-bit per storage element implementation, an additional data latch may be used. The programming operation, under the control of the state machine, comprises a series of programming voltage pulses applied to the control gates of the addressed storage elements. Each program pulse is followed by a read back (verify) to determine if the storage element has been programmed to the desired memory state. In some cases, processor 192 monitors the read back memory state relative to the desired memory state. When the two are in agreement, the processor 192 sets the bit line latch 182 so as to cause the bit line to be pulled to a state designating program inhibit. This inhibits the storage element coupled to the bit line from further programming even if program pulses appear on its control gate. In other embodiments the processor initially loads the bit line latch 182 and the sense circuitry sets it to an inhibit value during the verify process.

Each set of data latches 194-197 may be implemented as a stack of data latches for each sense module. In one embodiment, there are three data latches per sense module 180. In some implementations, the data latches are implemented as a shift register so that the parallel data stored therein is converted to serial data for data bus 120, and vice versa. All the data latches corresponding to the read/write block of storage elements can be linked together to form a block shift register so that a block of data can be input or output by serial transfer. In particular, the bank of read/write modules is adapted so that each of its set of data latches will shift data in to or out of the data bus in sequence as if they are part of a shift register for the entire read/write block.

The data latches identify when an associated storage element has reached certain mileposts in a programming operations. For example, latches may identify that a storage element's Vth is below a particular verify level. The data latches indicate whether a storage element currently stores one or more bits from a page of data. For example, the LDL latches can be used to store a lower page of data. An LDL latch is flipped (e.g., from 0 to 1) when a lower page bit is stored in an associated storage element. A UDL latch is flipped when an upper page bit is stored in an associated storage element. This occurs when an associated storage element completes programming, e.g., when its Vth exceeds a target verify level such as VvA, VvB or VvC.

Figure 3:
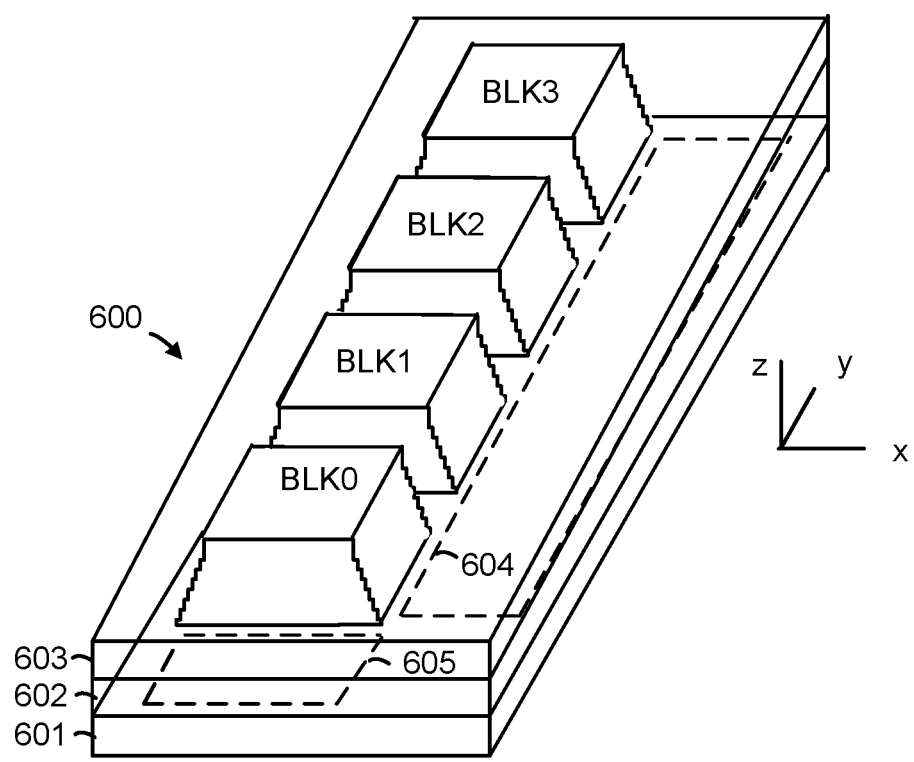
FIG. 3 is a perspective view of a memory device 600 comprising a set of blocks in a plane in an example 3D configuration of the memory structure 126 of FIG. 1A.

FIG. 3 is a perspective view of a memory device 600 comprising a set of blocks in a plane in an example 3D configuration of the memory structure 126 of FIG. 1A. On the substrate 601 are example blocks BLK0, BLK1, BLK2 and BLK3 of memory cells (storage elements) and peripheral areas with circuitry for use by the blocks. The peripheral area 604 runs along an edge of each block while the peripheral area 605 is at an end of the set of blocks.

The circuitry can include voltage drivers which can be connected to control gate layers, bit lines and source lines of the blocks. The substrate can also carry circuitry under the blocks, along with one or more lower metal layers which are patterned in conductive paths to carry signals of the circuitry. The blocks are formed in an intermediate region 602 of the memory device. In an upper region 603 of the memory device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. While four blocks are depicted as an example, two or more blocks can be used, extending in the x- and/or y-directions. Typically, the length of the blocks is much longer in the x-direction than the width in the y-direction.

In one possible approach, the blocks are in a plane, and the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device. The blocks could also be arranged in multiple planes.

Figure 4:
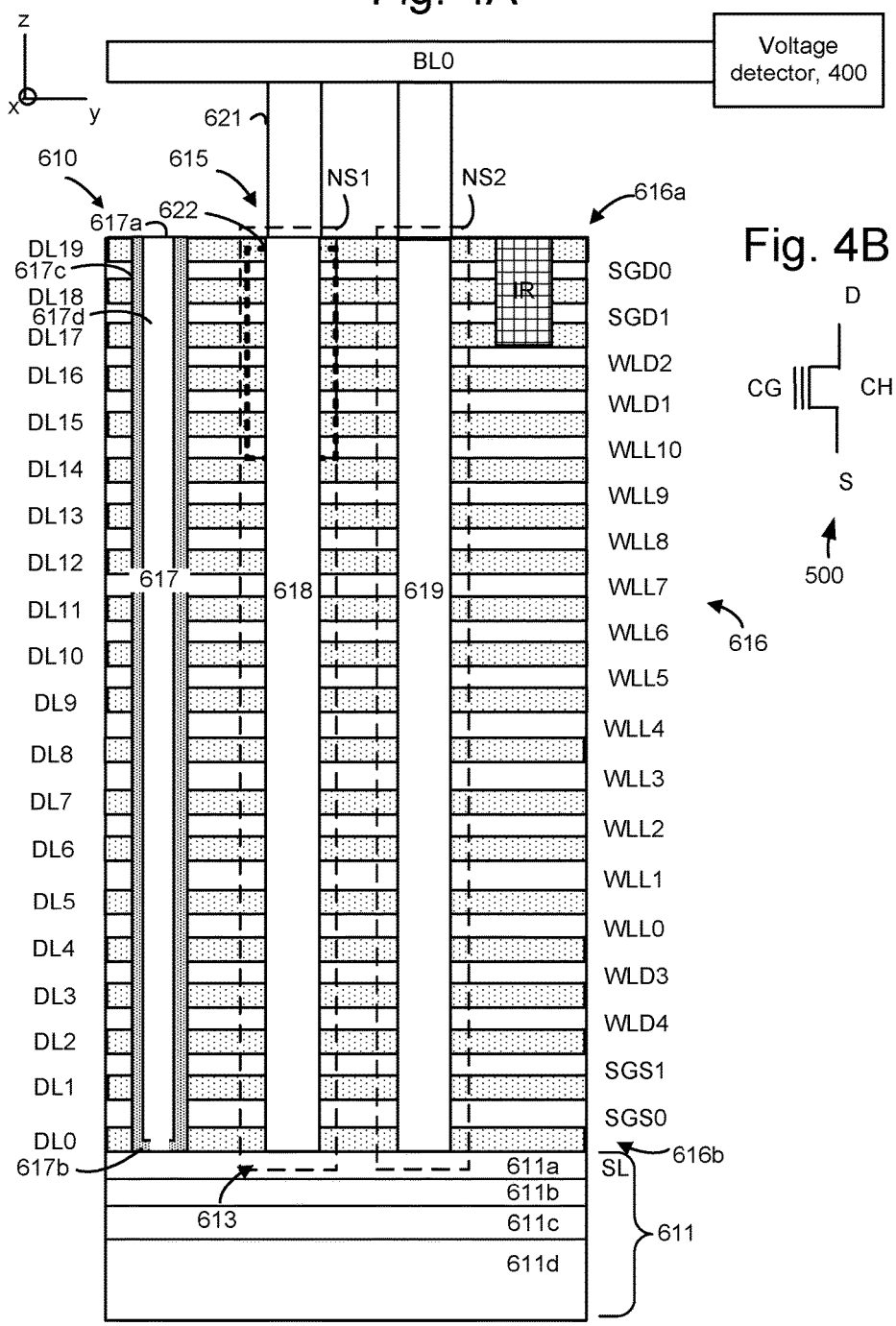
FIG. 4A depicts an example cross-sectional view of a portion of one of the blocks of FIG. 3.
FIG. 4B depicts an example transistor 500.

FIG. 4A depicts an example cross-sectional view of a portion of one of the blocks of FIG. 3. The block comprises a stack 610 of alternating conductive and dielectric layers. The block comprises conductive layers spaced apart vertically, and the conductive layers comprise word lines connected to the memory cells and select gate lines connected to SGD and SGS transistors.

In this example, the conductive layers or plates comprise two SGD layers, two SGS layers and four dummy word line layers (or word lines) WLD1, WLD2, WLD3 and WLD4, in addition to data word line layers (or word lines) WLL0-WLL10. WLD2 is a topmost dummy word line layer, and WLD1 is another dummy word line layer which is below the topmost dummy word line layer and above the topmost or drain-side data word line WLL10. WLD3 and WLD4 are source side dummy word line layers. The dielectric layers are labelled as DL0-DL19. Further, regions of the stack which comprise NAND strings NS1 and NS2 are depicted. Each NAND string encompasses a memory hole 618 or 619 which is filled with materials which form memory cells adjacent to the word lines. A region 622 of the stack is shown in greater detail in FIG. 5.

The stack includes a substrate 611. In one approach, a portion of the source line SL comprises an n-type source diffusion layer 611a in the substrate which is in contact with a source end of each string of memory cells in a block. The n-type source diffusion layer 611a is formed in a p-type well region 611b, which in turn is formed in an n-type well region 611c, which in turn is formed in a p-type semiconductor substrate 611d, in one possible implementation. The n-type source diffusion layer may be shared by all of the blocks in a plane, in one approach.

NS1 has a source-end 613 at a bottom 616b of the stack 616 or the plurality of word line layers and a drain-end 615 at a top 616a of the stack or the plurality of word line layers. Local interconnects, such as interconnect 617, may be provided periodically across the stack. The local interconnects may be metal-filled slits which extend through the stack, such as to connect the source line/substrate to a line above the stack. The metal 617d is isolated from the word line layers by an insulating material 617c. The slits may be used during the formation of the word lines and subsequently filled with metal. Specifically, a stack may be formed with a sacrificial material such as SiN for the word lines layers alternating with dielectric layers such as oxide. Slits are etched periodically in the stack down to the substrate, thereby exposing portions of the sacrificial material. An etchant such as hot phosphoric acid is deposited in the slits to remove the sacrificial material, forming voids. A metal is then deposited in the voids via the slits, thus forming the final word line layers. Subsequently, the metal in the slits is cleaned away and the insulating material 617c is deposited along the sidewalls of the slits. A hole is etched in the bottom of the insulation layer. The remainder of the slits is filled with the metal 617d which extends through the hole to the substrate and up to the top of the stack, thus forming a conductive path or local interconnect from the bottom to the top of the stack.

A portion of a bit line BL0 is also depicted. A conductive via connects the drain-end of each memory string to a bit line. For example, a conductive via 621 connects the drain-end 615 to BL0. The local interconnect 617 has a top 617a and a bottom 617b. The bottom is etched through to provide a contact to the substrate.

In one approach, the block of memory cells comprises a stack of alternating control gate and dielectric layers, and the memory cells are arranged in vertically extending memory holes in the stack.

In one approach, each block comprises a terraced edge in which vertical interconnects, e.g., pillars or posts, connect to each layer, including the SGS, WL and SGD layers, and extend upward to horizontal paths to voltage sources.

This example includes two SGD transistors, two drain side dummy memory cells, two source side dummy memory cells and two SGS transistors in each string, as an example. Generally, one or more SGD transistors and one or more SGS transistors may be provided in a memory string.

An isolation region IR may be provided to separate portions of the SGD layers from one another to provide one independently driven SGD line or layer portion per sub-block. The isolation region comprises an insulating material such as oxide. In one example, the word line layers are common to all sub-blocks in a block.

FIG. 4B depicts an example transistor 500. The transistor comprises a control gate CG, a drain D, a source S and a channel CH. During a programming operation, the transistor has a positive gate-to-channel voltage. During an erase operation, the transistor has a positive channel-to-gate voltage.

Figure 5:
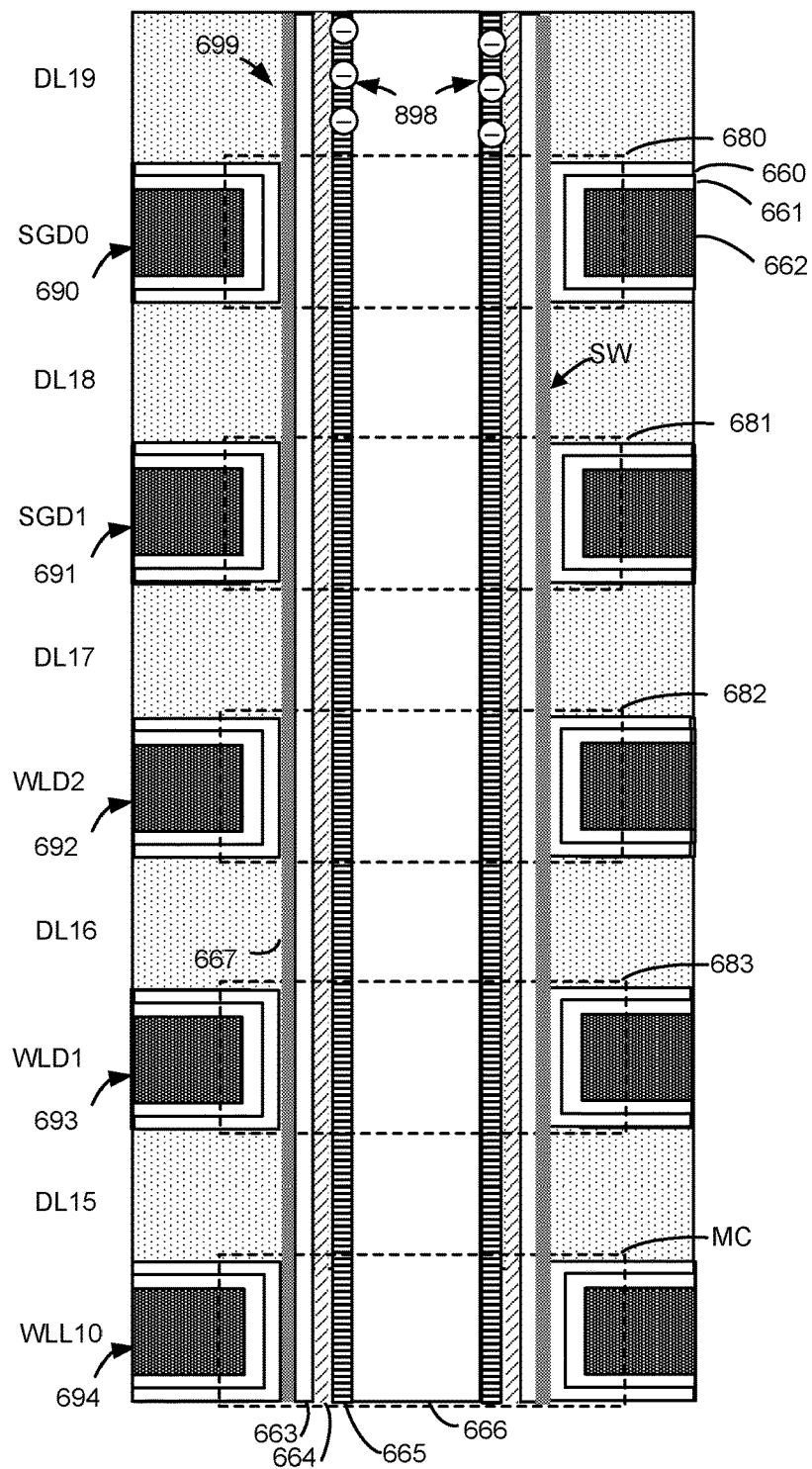
FIG. 5 depicts a close-up view of the region 622 of the stack of FIG. 4A.

FIG. 5 depicts a close-up view of the region 622 of the stack of FIG. 4A. Memory cells are formed at the different levels of the stack at the intersection of a word line layer and a memory hole. In this example, SGD transistors 680 and 681 are provided above dummy memory cells 682 and 683 and a data memory cell MC. A number of layers can be deposited along the sidewall (SW) of the memory hole and/or within each word line layer, e.g., using atomic layer deposition. For example, each pillar 699 or column which is formed by the materials within a memory hole can include a blocking oxide 667, a charge-trapping layer 663 or film such as silicon nitride ($Si_3N_4$) or other nitride, a tunneling layer 664 (such as oxide), a channel layer 665 (e.g., comprising polysilicon), and a dielectric core 666. A word line layer can include a block high-k material 660, a metal barrier 661, and a conductive metal 662 such as Tungsten as a control gate. For example, control gates 690, 691, 692, 693 and 694 are provided. Additional pillars are similarly formed in the different memory holes. The pillar 699 can form a columnar active area (AA) of a NAND string.

When a memory cell is programmed, electrons are stored in a portion of the charge-trapping layer which is associated with the memory cell. These electrons are drawn into the charge-trapping layer from the channel, and through the tunneling layer. The Vth of a memory cell is increased in proportion to the amount of stored charge. During an erase operation, the electrons return to the channel.

Each of the memory holes can be filled with a plurality of annular layers comprising a blocking oxide layer, a charge trapping layer, a tunneling layer and a channel layer. A core region of each of the memory holes is filled with a body material, and the plurality of annular layers are between the core region and the word line in each of the memory holes.

The NAND string can be considered to have a floating body channel because the length of the channel is not formed on a substrate. Further, the NAND string is provided by a plurality of word line layers above one another in a stack, and separated from one another by dielectric layers.

As mentioned at the outset, a channel gradient may be formed which causes a disturb of the SGD transistor 680. In particular, electrons 898 can be injected into the charge trapping layer on the drain side of the SGD transistors, e.g., above the transistors in a core height region of the stack. This region may be associated with D19, for instance. Once injected, the electrons cannot be removed by an erase operation for the SGD transistors because the portion of the charge trapping layer in which the electrons are injected is not directly adjacent to a control gate layer. This results in an increase in the upper tail of the Vth distribution of the SGD transistors, as shown in FIGS. 10A and 10B. Moreover, the increase in the upper tail becomes worse as program-erase cycles accumulate for a block.

FIG. 6A depicts an example implementation of the memory structure 126 of FIG. 1A comprising NAND strings in sub-blocks in a 3D configuration. In one approach, a block BLK of memory cells is formed from a stack of alternating conductive and dielectric layers. The block comprises conductive layers spaced apart vertically, and the conductive layers spaced apart vertically comprise word lines connected to the memory cells and select gate lines connected to SGD (drain-side select gate) and SGS (source-side select gate) transistors. In this example, the conductive layers comprise two SGD layers, two SGS layers and four dummy word line layers (or word lines) WLD1, WLD2, WLD3 and WLD4, in addition to data word line layers (or word lines) WLL0-WLL10. The dielectric layers are labelled as DL0-DL19. Each NAND string may be formed in a memory hole in the stack is filled with materials which form memory cells adjacent to the word lines.

Further, each block can be divided into sub-blocks and each sub-block includes multiple NAND strings, where one example NAND string is depicted. For example, sub-blocks SB0, SB1, SB2 and SB3 comprise example NAND strings 700n, 710n, 720n and 730n, respectively. The NAND strings have data word lines, dummy word lines and select gate lines. Each sub-block comprises a set of NAND strings which extend in the x direction and which have a common SGD line. SB0 has SGD lines or SGD layer portions 810 and 814 in the SGD0 and SGD1 layers, respectively. SB1 has SGD layer portions 811 and 815 in the SGD0 and SGD1 layers, respectively. SB2 has SGD layer portions 812 and 816 in the SGD0 and SGD1 layers, respectively. SB3 has SGD layer portions 813 and 817 in the SGD0 and SGD1 layers, respectively. Each of the data word line layers WLL0 to WLL10 and the SGS layers SGS0 and SGS1 is shared by all of the sub-blocks SB0 to SB3. The dummy word line layers are also shared by all of the sub-blocks.

The NAND strings 700n, 710n, 720n and 730n are in sub-blocks SB0, SB1, SB2 and SB3, respectively. Programming of the block may occur one sub-block at a time. Within each sub-block, a word line programming order may be followed, e.g., starting at WL0, the source-side word line and proceeding one word line at a time to WLL10, the drain-side word line.

The NAND strings 700n, 710n, 720n and 730n have channels 700a, 710a, 720a and 730a, respectively. Each channel has a drain end and a source end. For example, the channel 700a has a drain end 790 and a source end 791.

Additionally, NAND string 700n includes SGS transistors 700 and 701, dummy memory cells 702 and 703, data memory cells 704, 705, 706, 707, 708, 709, 710, 711, 712, 713 and 714, dummy memory cells 715 and 716, and SGD transistors 717 and 718.

NAND string 710n includes SGS transistors 720 and 721, dummy memory cells 722 and 723, data memory cells 724, 725, 726, 727, 728, 729, 730, 731, 732, 733 and 734, dummy memory cells 735 and 736, and SGD transistors 737 and 738.

NAND string 720n includes SGS transistors 740 and 741, dummy memory cells 742 and 743, data memory cells 744, 745, 746, 747, 748, 749, 750, 751, 752, 753 and 754, dummy memory cells 755 and 756, and SGD transistors 757 and 758.

NAND string 730n includes SGS transistors 760 and 761, dummy memory cells 762 and 763, data memory cells 764, 765, 766, 767, 768, 769, 770, 771, 772, 773 and 774, dummy memory cells 775 and 776, and SGD transistors 777 and 778.

Figure 6B:
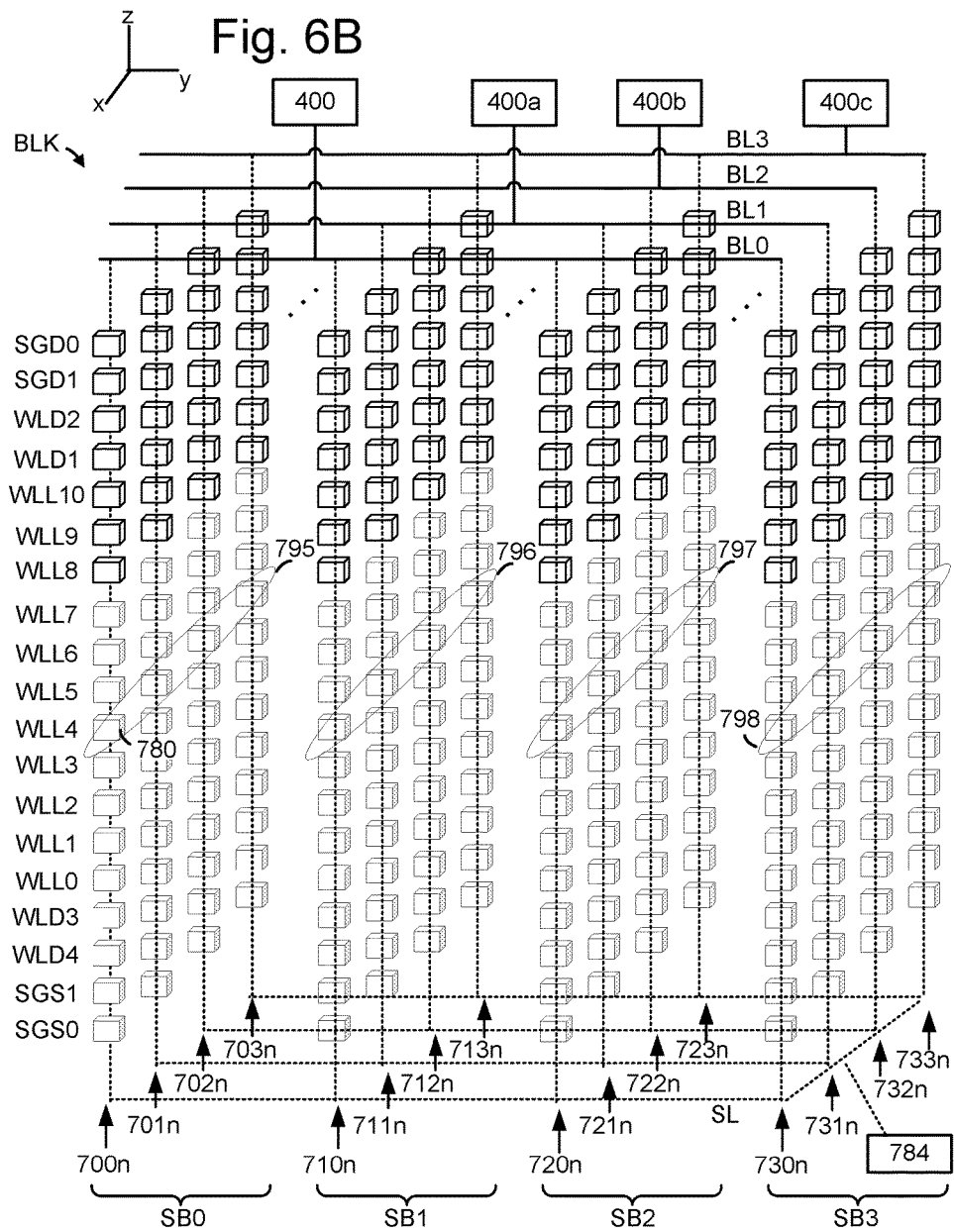
FIG. 6B depicts a perspective view of sub-blocks SB0-SB3 consistent with FIG. 6A.

FIG. 6B depicts a perspective view of sub-blocks SB0-SB3 consistent with FIG. 6A. A sub-block is a portion of a block and represents a set of memory strings which are programmed together and which have a common SGD line. Also, each memory string in a sub-block is connected to a different bit line, in one approach.

Example memory cells are depicted which extend in the x direction along word lines in each sub-block. Each memory cell is depicted as a cube for simplicity. SB0 includes NAND strings 700n, 701n, 702n and 703n. SB1 includes NAND strings 710n, 711n, 712n and 713n. SB2 includes NAND strings 720n, 721n, 722n and 723n. SB3 includes NAND strings 730n, 731n, 732n and 733n. Bit lines are connected to sets of NAND strings. For example, a bit line BL0 is connected to NAND strings 700n, 710n, 720n and 730n, a bit line BL1 is connected to NAND strings 701n, 711n, 721n and 731n, a bit line BL2 is connected to NAND strings 702n, 712n, 722n and 732n, and a bit line BL3 is connected to NAND strings 703n, 713n, 723n and 733n. A sense circuit may be connected to each bit line. For example, sense circuits 400, 400a, 400b and 400c are connected to bit lines BL0, BL1, BL2 and BL3, respectively. The NAND strings are examples of vertical memory strings which extend upward from a substrate.

Programming and reading can occur for selected cells of one word line and one sub-block at a time. This allows each selected cell to be controlled by a respective bit line. For example, an example set 795 of memory cells (including an example memory cell 780) in SB0 is connected to WLL4. Similarly, the sets 796, 797 and 798 comprise data memory cells in SB1, SB2 and SB3 are connected to WLL4.

A voltage detector 784 may be used to monitor the substrate voltage (see FIG. 6C), for example, to determine when to raise Vsgd in an erase operation. See FIGS. 13, 14D, 15D and 16D.

Figure 6C:
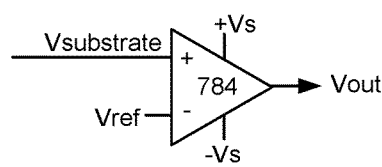
FIG. 6C depicts an example embodiment of the voltage detector 784 of FIG. 6B.

FIG. 6C depicts an example embodiment of the voltage detector 784 of FIG. 6B. The voltage detector may comprise an operational amplifier comparator, for instance. The comparator includes a non-inverting input which receives Vsubstrate, an inverting input which receives a reference voltage Vref, positive and negative power supplies+Vs and −Vs, respectively and an output which provides Vout. Vout=+Vs if Vsubstrate>Vref and Vout=−Vs if Vsubstrate<Vref. The analog output value can be provided to a controller which converts it to a 0 or 1 bit to represent Vsubstrate>Vref or Vsubstrate<Vref, respectively. If the bit=0, the controller can initiate a hold of the erase voltage at the level of V1, which is slightly higher than Vref in one approach. If the bit=1, the controller continues to ramp up the substrate voltage. As shown in FIGS. 13, 14D, 15D and 16D, Vsgd may be raised when the substrate reaches a specified voltage.

FIG. 7A depicts an example threshold voltage (Vth) distribution of a set of memory cells, where four data states are used. The set of memory cells may be connected to a common word line. The Vth distribution is obtained after a programming operation. A Vth distribution 800 is provided for erased (Er) state memory cells. Three Vth distributions 801, 802 and 803 represent assigned data states A, B and C, respectively, which are reached by memory cells when their Vth exceeds the erase-verify voltage VvA, VvB or VvC, respectively. This example uses four data states. Other numbers of data states can be used as well, such as eight or sixteen. Read voltages VrA, VrB and VrC are used to read data from a set of cells having this Vth distribution. An erase-verify voltage VvEr is used in an erase-verify test to determine whether the erase operation is completed.

A programming operation can use one or more programming passes. A one pass programming operation involves one sequence of multiple program-verify operations (or program loops) which are performed starting from an initial Vpgm level and proceeding to a final Vpgm level until the threshold voltages of a set of selected memory cells reach the verify voltages of the assigned data states. All memory cells may initially be in the erased state at the beginning of the programming pass. After the programming pass is completed, the data can be read from the memory cells using read voltages which are between the Vth distributions. At the same time, a read pass voltage, Vpass (e.g., 8-10 V), is applied to the remaining word lines. By testing whether the Vth of a given memory cell is above or below one or more of the read reference voltages, the system can determine the data state which is represented by a memory cell. These voltages are demarcation voltages because they demarcate between Vth ranges of different data states.

FIG. 7B depicts an example Vth distribution of a set of memory cells, where eight data states are used. For the Er, A, B, C, D, E, F and G states, we have Vth distributions 820, 821, 822, 823, 824, 825, 826 and 827, respectively program-verify voltages VvA, VvB, VvC, VvD, VvE, VvF and VvG, respectively, and read voltages VrA, VrB, VrC, VrD, VrE, VrF and VrG, respectively. An erase-verify voltage VvEr is used during an erase operation.

FIG. 8 depicts a waveform of an example programming operation. The horizontal axis depicts a program loop (PL) number and the vertical axis depicts control gate or word line voltage. Generally, a programming operation can involve applying a pulse train to a selected word line, where the pulse train includes multiple program loops or program-verify iterations. The program portion of the program-verify iteration comprises a program voltage, and the verify portion of the program-verify iteration comprises one or more verify voltages.

Each program voltage includes two steps, in one approach. Further, Incremental Step Pulse Programming (ISPP) is used in this example, in which the program voltage steps up in each successive program loop using a fixed or varying step size. This example uses ISPP in a single programming pass in which the programming is completed. ISPP can also be used in each programming pass of a multi-pass operation.

The waveform 900 includes a series of program voltages 901, 902, 903, 904, 905, . . . 906 that are applied to a word line selected for programming and to an associated set of non-volatile memory cells. One or more verify voltages can be provided after each program voltage as an example, based on the target data states which are being verified. 0 V may be applied to the selected word line between the program and verify voltages. For example, A- and B-state verify voltages of VvA and VvB, respectively, (waveform 910) may be applied after each of the program voltages 901 and 902. A-, B- and C-state verify voltages of VvA, VvB and VvC (waveform 911) may be applied after each of the program voltages 903 and 904. After several additional program loops, not shown, E-, F- and G-state verify voltages of VvE, VvF and VvG (waveform 912) may be applied after the final program voltage 906.

FIG. 9A depicts a plot of erase voltages in an example erase operation. The erase voltages can be applied to the source end of a set of memory strings via a substrate, and/or to the drain end of the set of memory strings via bit lines. The erase voltages can be applied to the substrate via a local interconnect. The vertical axis depicts Verase and the horizontal axis depicts the erase loop number. Verase has an initial magnitude of Verase1 and steps up in magnitude in each successive erase loop, e.g., to Verase2, Verase3 and so forth. Three loops are shown as an example. Erase voltages 920, 921 and 922 are applied in the erase loops 1, 2 and 3, respectively. Verase1, Verase2, Verase3 and so forth is the peak voltage applied to the substrate and/or bit line in an erase loop. Additionally, a channel pre-charge period can be provided before each erase voltage as depicted by pc1, pc2 and pc3, and as discussed further below.

FIG. 9B depicts a plot of erase-verify voltages applied to word lines in a block, consistent with the example of FIG. 9A. The vertical axis depicts Vwl (word line voltage) and the horizontal axis depicts the erase loop number. An example erase-verify voltage 923 is depicted. This voltage (VvEr) may have a magnitude near 0 V, for example. An erase-verify voltage is typically applied after each erase voltage as part of an erase-verify test of a block.

FIG. 10A depicts a plot of a number of SGD transistors versus Vth, for a fresh block of memory cells, and for different temperatures. As mentioned, the upper tail of the Vth distribution of the SGD transistors increases due to a disturb in an erase operation. The plots 1000, 1001 and 1002 represent the Vth distribution at low, room and high temperatures, respectively. The upper tail is greater when the temperature is lower. Even for a fresh block, there is significant disturb caused by erasing and then programming the SGD transistors. Note that when multiple SGD transistors are present in a memory string (e.g., the transistors of SGD0 and SGD1 in FIG. 6A), the disturb occurs mainly on the SGD transistor which is closest to the drain end of the memory string (e.g., the transistors of SGD0).

At higher temperatures, the channel can be charged up faster so that the gradient near the SGD transistors exists for a shorter time than at lower temperatures. The amount of disturb is therefore relatively less at higher temperatures.

FIG. 10B depicts a plot of a number of SGD transistors versus Vth, for a cycled block of memory cells, and for different temperatures. The upper tail increases as program-erase cycles are accumulated, because additional electrons can be injected into the charge trapping layer over time. The plots 1003, 1004 and 1005 represent the Vth distribution at low, room and high temperatures, respectively. Moreover, the increase in the upper tail is significant even for the high temperature case.

Figure 11:
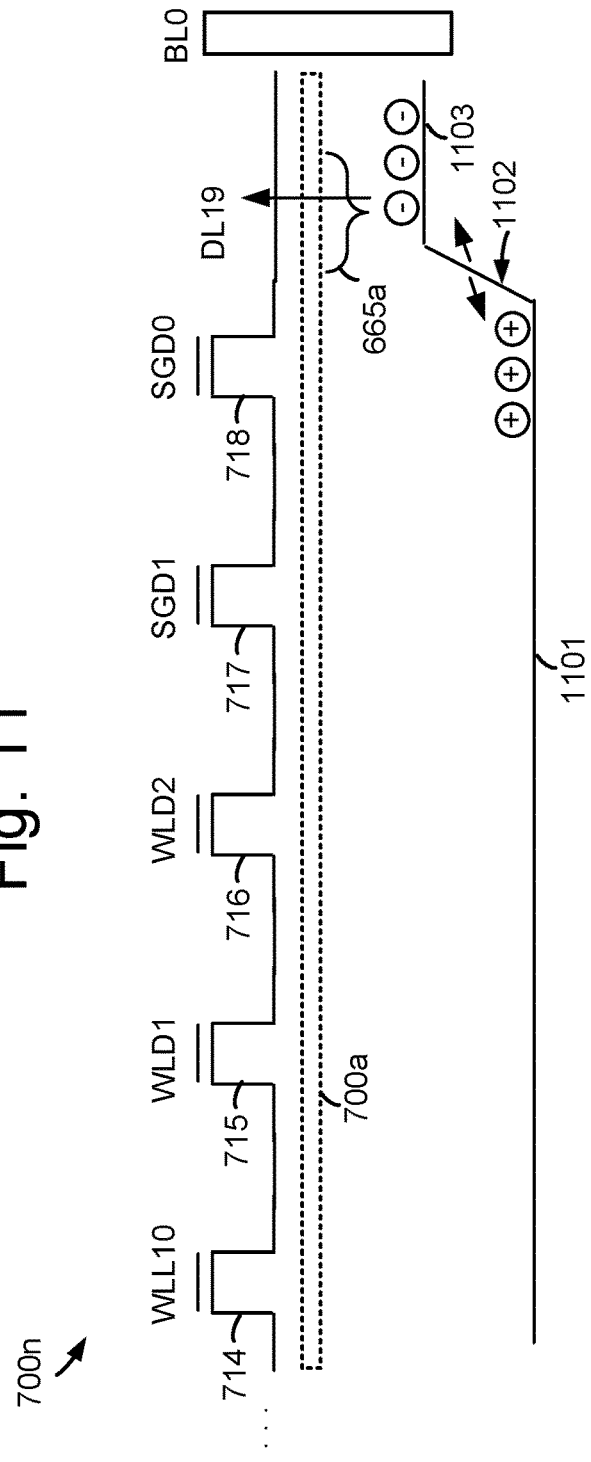
FIG. 11 depicts a plot of a channel voltage versus memory string position during an erase operation, showing a channel gradient which causes a disturb in a region near an SGD transistor.

FIG. 11 depicts a plot of a channel voltage versus memory string position during an erase operation, showing a channel gradient which causes a disturb in a region near an SGD transistor. A portion of the memory string 700n and its channel 700a of FIG. 6A is depicted. The string 700n includes a data memory cell 714 connected to WLL10, dummy memory cells 715 and 716 connected to WLD1 and WLD2, respectively, and SGD transistors 717 and 718 connected to SGD1 and SGD0, respectively. Plots 1101, 1102 and 1103 represent a voltage along the length of the channel. If we assume the erase voltage has just been applied to the substrate and to the bit line (BL0), the channel voltage adjacent to the transistors 714-718 will be relatively low because it has not yet been fully charged up, and the channel voltage in the channel region 665a (adjacent to the dielectric layer DL19) will be relatively high because the metal bit line is charge up very quickly.

The channel gradient represented by the plot 1102 generates electron-hole pairs in the channel. The electrons can be accelerated and injected into the charge trapping layer of the channel region 665a, causing a disturb. Example electrons are denoted by "−" and holes are denoted by "+". Eventually, the channel voltage uniformly reaches a charge up level which is close to Verase. The channel is fully charged up at this point so that erasing of the memory cells can occur.

Figure 12A:
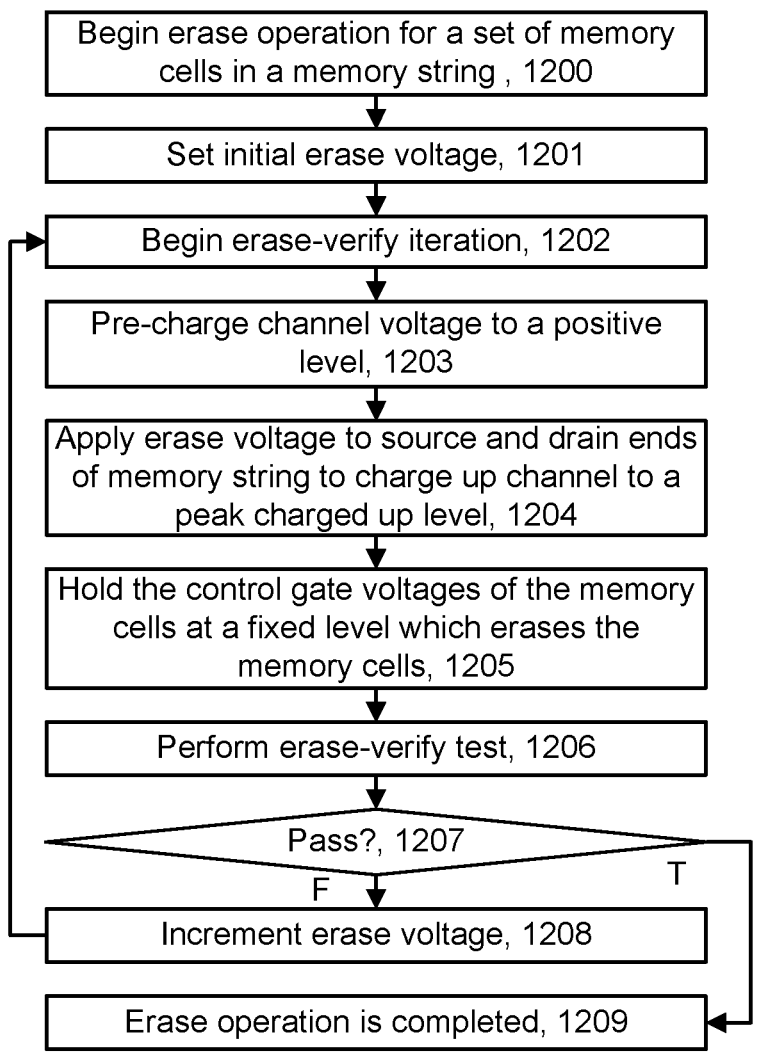
FIG. 12A depicts an example process for performing an erase operation.

FIG. 12A depicts an example process for performing an erase operation. Step 1200 begins an erase operation for a set of memory cells in a memory string. The erase operation may involve many memory strings in a block, for instance. Step 1201 sets an initial erase voltage (Verase1 in FIG. 9A). Step 1202 begins an erase-verify iteration. Step 1203 includes pre-charging the channel voltage to a positive level, e.g., a few Volts such as 3-5 V, which is less than a peak level, e.g., 20 V or more. Step 1204 includes applying an erase voltage to the source and drain ends of the memory string to charge up the channel to a peak level. Step 1205 includes holding the control gate voltages of the memory cells at a fixed level, e.g., 0-0.5 V, which erases the memory cells. That is, with the channel fully charged up and the word line voltages held at a low level, there is sufficiently large channel-to-gate voltage which erases the memory cells. Step 1206 includes performing an erase-verify test, e.g., using VvEr in FIG. 7A or 7B. A decision step 1207 determines if the verify test is passed. If decision step 1207 is true, the erase operation is completed at step 1209. If decision step 1207 is false, the erase voltage is incremented at step 1208 and a next erase-verify iteration (erase loop) begins at step 1202.

Figure 12B:
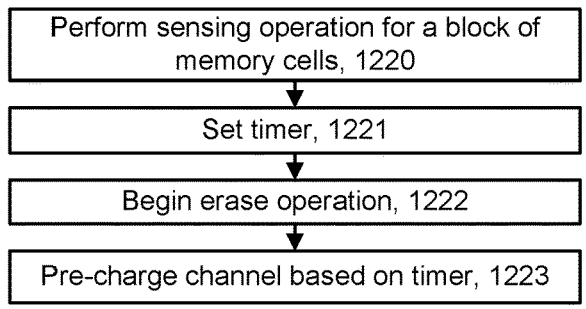
FIG. 12B depicts an example process for pre-charging a channel, consistent with step 1203 of FIG. 12A, where the pre-charging is based on an elapsed time since a last sensing operation.

FIG. 12B depicts an example process for pre-charging a channel, consistent with step 1203 of FIG. 12A, where the pre-charging is based on an elapsed time since a last sensing operation. As discussed also in connection with FIG. 17A to 18B, a sensing operation can cause the voltages of the word lines to float at a positive level such as a few Volts. When an erase operation is subsequently performed and the word line voltages are driven at a low level such as 0-0.5 V, this can result in a down coupling of the channel voltage. That is, there is a capacitive coupling from the word lines to the channel such that a decrease in the word line voltage results in a decrease in the channel voltage. This makes it harder to charge up the channel during the erase operation. One solution provided herein is to adjust a pre-charge process in an erase operation in a block based on the elapsed time since a last sense operation in the block.

Step 1220 includes performing a sensing operation for a block of memory cells. This can be a read operation or a program-verify operation, for example. Step 1221 includes setting a timer. See the timer 117 in FIG. 1A. Step 1222 includes beginning an erase operation for the block. This could be minutes or hours after the sensing operation, for instance. Step 1223 includes pre-charging the channel based on the timer. For example, when the elapsed time is relatively short, the floating voltage of the word lines is relatively high, so that the amount of down coupling of the channel is relatively great when the word line voltages are driven lower. The pre-charging process can compensate by providing a higher degree of pre-charge and/or a longer pre-charge, for instance, as described further below.

Figure 12C:
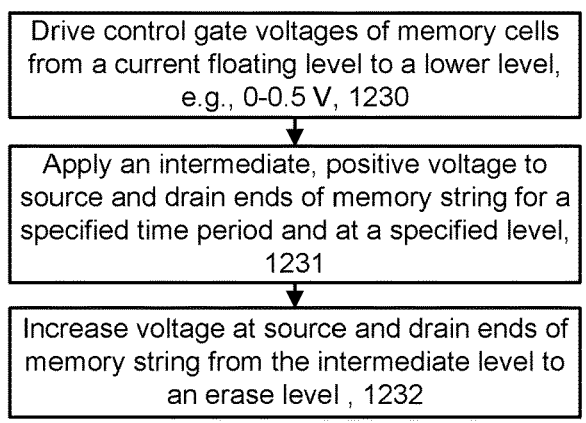
FIG. 12C depicts an example process for pre-charging a channel, consistent with step 1203 of FIG. 12A, where the pre-charging involves applying an intermediate, positive voltage to source and drain ends of a memory string.

FIG. 12C depicts an example process for pre-charging a channel, consistent with step 1203 of FIG. 12A, where the pre-charging involves applying an intermediate, positive voltage to source and drain ends of a memory string. See FIG. 14A to 14D, for example. Step 1230 includes driving control gate voltages of the memory cells from a current floating level to a lower level, e.g., 0-0.5 V. The current floating level could be up to about 4 V, for example, depending on the time since the last sensing operation. The floating level decreases with the time. Step 1231 includes applying an intermediate, positive voltage to the source and drain ends of a memory string for a specified time period and at a specified level. The specified level can be, e.g., 3-5 V, and is less than the peak erase voltage. The specified time period can be sufficient for the channel voltage to recover from its down coupled level (less than 0 V, such as −2 to −4 V) to 0 V and then higher to a small positive level such as 2-3 V. Step 1232 includes increasing the voltage at the source and drain ends of the memory string from the intermediate level to an erase level. The pre-charging increases the channel voltage on the source side of the SGD transistor of a memory string, so that there is a smaller channel gradient and a reduced amount of electron injection into the charge trapping layer above the SGD transistor, near DL19, when Verase is applied.

Figure 12D:
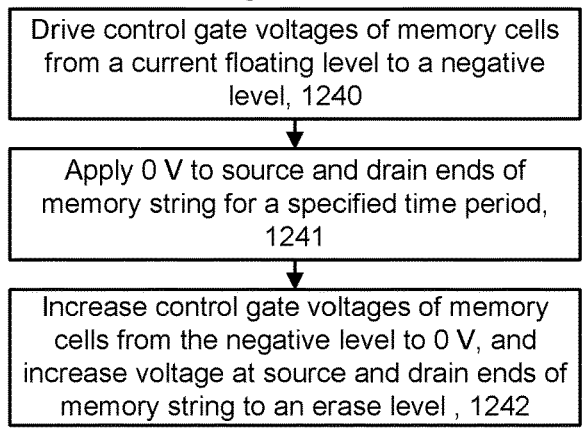
FIG. 12D depicts an example process for pre-charging a channel, consistent with step 1203 of FIG. 12A, where the pre-charging involves driving control gate voltages of memory cells to a negative level, followed by driving the control gate voltages of the memory cells to a higher level such as 0 V.

FIG. 12D depicts an example process for pre-charging a channel, consistent with step 1203 of FIG. 12A, where the pre-charging involves driving control gate voltages of memory cells to a negative level, followed by driving the control gate voltages of the memory cells to a higher level such as 0 V. See FIG. 15A to 15D, for example. Step 1240 includes driving control gate voltages of the memory cells from a current floating level to a negative level, e.g., −2 to −4 V. Step 1241 includes applying 0 V, for instance, to the source and drain ends of a memory string for a specified time period. The specified time period can be sufficient for the channel voltage to recover from its down coupled level (less than 0 V, such as −4 to −6 V) to 0 V. Step 1242 includes increasing the control gate voltages of the memory cells from the negative level to 0-0.5 V, for instance and increasing the voltage at the source and drain ends of the memory string from 0 V to an erase level.

By driving the word line voltages at a negative level instead of 0 V, the channel voltage is down coupled to a relatively lower (more negative) level. This results in enhanced hole generation so that the channel voltage recovers to 0 V at a relatively faster rate. Further, the channel voltage receives another boost from the up coupling due to the increase in the word line voltages from the negative level to 0-0.5 V, for instance. This can be the level at which the word line voltages are normally held during erase of the memory cells, while the channel is boosted to its peak level.

FIG. 13A to 13D depict voltages in one example of an erase operation, where a channel voltage (Vchannel) is down coupled and does not have time to recover to 0 V, resulting in SGD transistor disturb, and where FIG. 13A depicts a word line voltage (Vwl), FIG. 13B depicts Vchannel, FIG. 13C depicts a source line voltage (Vsl) and a bit line voltage (Vbl), and FIG. 13D depicts a drain side select gate voltage (Vsgd) and a source side select gate voltage (Vsgs). The horizontal axes denote time. In one example, Vwl represents both dummy and data word lines when both dummy and data memory cells are erased.

In FIG. 13A to 16D, the first and second erase-verify iterations, EV1 and EV2, respectively, of an erase operation are depicted. In one approach, any subsequent erase-verify iterations or loops are similar to the second erase-verify iteration or loop. The first erase-verify iteration or loop may be different because of the floating voltage of the word lines at the start of an erase operation. As mentioned, the word line voltage can float at a positive level which is a decreasing function of the time since the last sensing operation. For the second and subsequent erase-verify iterations, the word line voltages are not floating at this positive level, in some implementations.

The plot 1300 represents Vwl in EV1. From t0-t1, Vwl is floating at a positive level Vfloat, which could be up to about 4 V, for example. At t1, the word line voltages are driven at a low level such as 0-0.5 V. This is a level which is suitable for erasing the memory cells when the channel is charged up. When the word line voltages are driven, the word line voltages decrease from Vfloat to 0.5 V, for example, resulting in down coupling of Vchannel (plot 1310). Vchannel beings to recover. Specifically, if the SGS transistors are biased such that Vsgd−Vsl<Vth (where Vsgd is the SGS control gate voltage and Vsl is the source line or substrate voltage), hole current can flow in to the channel to charge up the channel back toward 0 V. Essentially, a channel gradient exists at the source end of the memory string. However, this takes some time. In this example, at t2, Vchannel is still less than 0 V (plot 1310), so that a significant channel gradient will occur which causes a SGD disturb. Vsl and Vbl are increased from 0 V to Verase1 (e.g., 20 V or more) at t2 (plot 1320). The channel is charged up further to its peak charged up level, e.g., the highest level it will reach in the current erase-verify iteration.

Vchannel follows Vsl and Vbl, but with a delay, as the channel is charged up to slightly less than Verase1.

Vsgd and Vsgs may be kept low at about 0.5 V from t1-t3 (plot 1330a). Vsgs remains at the low level until t5 (plot 1330c) while Vsgd is allow to float starting at t3 (plot 1330b, where the dotted line denotes floating), when Vsl reaches a specified level. In one example, the substrate voltage detector 784 of FIG. 6C may be used to detect when Vsl reaches a level such as 12 V (Vref=12 V). Vout triggers the floating of Vsgd. By floating Vsgd, the channel to gate voltage across the SGD transistors is minimized to avoid erasing them. Moreover, by driving Vsgd until Vsl is charged up to a specified level, Vsgd is kept at a desired level and not subject to up coupling from other sources such as the local interconnect. Vsl and Vbl are kept at Verase1 until t5 and then returned to 0 V. A verify test is performed from ts1-ts2.

Note that Vsl and Vbl are shown as having a common peak level of Verase1 in this example, but in other examples they may have different peak erase levels. The erase levels in general are sufficiently high to charge up the channel to a level which is suitable for erasing the memory cells.

In EV2, the word lines are driven at the low level of 0.5 V (plot 1301) from t6410 so that no down coupling of the channel occurs. In this approach, the time allocated for Vchannel to recover is omitted so that the time for EV2 can be less than the time for EV1. Vchannel may be at about 0 V from t6-t7. Vsl and Vbl are increased from 0 V to Verase2 at t7 (plot 1321), where Verase2>Verase1, causing the channel to be charged up to its peak charged up level which may be slightly higher than in EV1. Vchannel follows Vsl and Vbl, but with a delay (plot 1311). Vsgd and Vsgs may be kept low at about 0.5 V from t6-t8 (plot 1331a). Vsgs remains at the low level until t10 (plot 1331c) while Vsgd is allow to float starting at t8 (plot 1331b, where the dotted line denotes floating), when Vsl reaches a specified level. Vsl and Vbl are kept at Verase2 until t10 and then returned to 0 V. A verify test is performed from ts3-ts4.

FIG. 14A to 14D depict voltages in one example of an erase operation consistent with the process of FIG. 12C, where a channel voltage is down coupled and its recovery is accelerated by providing an intermediate voltage Vint on a source and a bit line, thereby reducing SGD transistor disturb, and where FIG. 14A depicts Vwl, FIG. 14B depicts Vchannel, FIG. 14C depicts Vsl and Vbl, and FIG. 14D depicts Vsgd and Vsgs.

The plot 1400 represents Vwl in EV1. From t0-t1, Vwl is floating at a positive level Vfloat. At t1, the word line voltages are driven at a low level such as 0-0.5 V. The word line voltages decrease from Vfloat to 0.5 V, for example, resulting in down coupling of Vchannel (plot 1410). The recovery of Vchannel is expedited by driving Vsl and Vbl from an initial level (e.g., 0 V) to an intermediate level of Vint (plot 1420). This provides some charging of the channel which is less than that provided when Vsl and Vbl are at their peak levels in the erase-verify iteration. As a result, Vchannel increases to 0 V at t1a and to a positive level at t2 when Vsl and Vbl are increased from Vint to Verase1. Since Vchannel is at a relatively higher level, the channel gradient of FIG. 11 is reduced. SGD disturb is therefore also reduced.

Vsgd and Vsgs may be kept low at about 0.5 V from t1-t3 (plot 1430a). Vsgs remains at the low level until t5 (plot 1430c) while Vsgd is allow to float starting at t3 (plot 1430b, where the dotted line denotes floating), when Vsl reaches a specified level, as discussed. Vsl and Vbl are kept at Verase1 until t5 and then returned to 0 V. A verify test is performed from ts1-ts2. In EV2, the word lines are driven at the low level of 0.5 V (plot 1401) from t6-t10 so that no down coupling of the channel occurs. In one approach, the time allocated for Vchannel to recover can be omitted so that the time for EV2 can be less than the time for EV1, in one implementation. In another approach, some time can be allocated for pre-charging the channel where this time is less than in EV1. Vsl and Vbl can be provided at Vint as in EV1, if desired, but for a shorter duration. Or, EV2 in this example can follow EV2 in FIG. 14A to 14D, where Vsl and Vbl are kept at 0 V until they are increased to Verase2.

Here, Vsl and Vbl are driven at Vint from t6-t7, increasing Vchannel. Vsl and Vbl are increased from Vint to Verase2 at t7 (plot 1421) causing the channel to be charged up to its peak charged up level. Vchannel follows Vsl and Vbl, but with a delay (plot 1411). Vsgd and Vsgs may be kept low at about 0.5 V from t6-t8 (plot 1431a). Vsgs remains at the low level until t10 (plot 1431c) while Vsgd is allow to float starting at t8 (plot 1431b, where the dotted line denotes floating), when Vsl reaches a specified level. Vsl and Vbl are kept at Verase2 until t10 and then returned to 0 V. A verify test is performed from ts3-ts4.

FIG. 15A to 15D depict voltages in one example of an erase operation consistent with the process of FIG. 12D, where a channel voltage is down coupled and its recovery is accelerated by Vwl being at a negative level and then at a higher level such as 0 V, thereby reducing SGD transistor disturb, and where FIG. 15A depicts Vwl, FIG. 15B depicts Vchannel, FIG. 15C depicts Vsl and Vbl, and FIG. 15D depicts Vsgd and Vsgs.

The plot 1500 represents Vwl in EV1. From t0-t1, Vwl is floating at a positive level Vfloat. At t1, the word line voltages are driven at a negative level such as −2 to −4 V. The word line voltages decrease from Vfloat to the negative level, resulting in down coupling of Vchannel (plot 1510). The down coupling is greater than in FIG. 13B or 14B. Vchannel increases to 0 V at t1a and remains at about 0 V from t1a-t2, in this example. The time period of t2-t1 is sufficiently large for Vchannel to recover with some time margin remaining, as an example. At t2, Vsl and Vbl are increased from 0 V to Verase1. Also at t2, Vwl is increased from its negative level to 0 V, for example. This provides an up coupling of Vchannel (plot 1511) to a positive level. The up coupling is an increase due to capacitive coupling. Since Vchannel is at a relatively higher level when Vsl and Vbl are increased, the channel gradient of FIG. 11 is reduced. SGD disturb is therefore also reduced.

Vsgd and Vsgs may be kept low at about 0.5 V from t1-t3 (plot 1530a). Vsgs remains at the low level until t5 (plot 1530c) while Vsgd is allow to float starting at t3 (plot 1530b, where the dotted line denotes floating), when Vsl reaches a specified level, as discussed. Vsl and Vbl are kept at Verase1 until t5 and then returned to 0 V. A verify test is performed from ts1-ts2. In EV2, the word lines are driven at the low level of 0.5 V (plot 1501) from t6-t10 so that no down coupling of the channel occurs.

In one approach, the time allocated for Vchannel to recover can be omitted so that the time for EV2 can be less than the time for EV1, in one implementation. In another approach, some time can be allocated for pre-charging the channel where this time is less than in EV1. Vsl and Vbl can be provided at Vint as in EV1, if desired, but for a shorter duration. Or, EV2 in this example can follow EV2 in FIG. 14A to 14D, where Vsl and Vbl are kept at 0 V until they are increased to Verase2.

Here, Vsl and Vbl are driven at Vint from t6-t7, increasing Vchannel. Vsl and Vbl are increased from Vint to Verase2 at t7 (plot 1521) causing the channel to be charged up to its peak charged up level. Vchannel follows Vsl and Vbl, but with a delay (plot 1511). Vsgd and Vsgs may be kept low at about 0.5 V from t6-t8 (plot 1531a). Vsgs remains at the low level until t10 (plot 1531c) while Vsgd is allow to float starting at t8 (plot 1531b, where the dotted line denotes floating), when Vsl reaches a specified level. Vsl and Vbl are kept at Verase2 until t10 and then returned to 0 V. A verify test is performed from ts3-ts4.

FIG. 16A to 16D depict voltages in one example of an erase operation consistent with the processes of FIGS. 12C and 12D, where FIG. 16A depicts Vwl, FIG. 16B depicts Vchannel, FIG. 16C depicts Vsl and Vbl, and FIG. 16D depicts Vsgd and Vsgs. This example uses the negative word line voltage and the intermediate Vsl and Vbl in EV1, and the intermediate Vsl and Vbl in EV2. This shows how the different features can be combined to further expedite the pre-charging of the channel. The plot 1600 represents Vwl in EV1. From t041, Vwl is floating at a positive level Vfloat. At t1, the word line voltages are driven at a negative level such as −2 to −4 V. When the word line voltages are driven, the word line voltages decrease from Vfloat to the negative level, resulting in down coupling of Vchannel (plot 1610). Vchannel increases to 0 V at t1a and remains at about 0 V from t1a-t2, in this example. The time period of t241 is sufficiently large for Vchannel to recover with some time margin remaining, as an example. Also, from t1-t2, Vsl and Vbl are driven at Vint, further expediting the charging of the channel. At t2, Vsl and Vbl are increased from Vint to Verase. Also at t2, Vwl is increased from its negative level to 0 V, for example. This provides an up coupling of Vchannel (plot 1611) to a positive level. Since Vchannel is at a relatively higher level when Vsl and Vbl are increased, the channel gradient of FIG. 11 is reduced. SGD disturb is therefore also reduced.

Vsgd and Vsgs may be kept low at about 0.5 V from t1-t3 (plot 1630a). Vsgs remains at the low level until t5 (plot 1630c) while Vsgd is allow to float starting at t3 (plot 1630b, where the dotted line denotes floating), when Vsl reaches a specified level, as discussed. Vsl and Vbl are kept at Verase1 until t5 and then returned to 0 V. A verify test is performed from ts1-ts2. In EV2, the word lines are driven at the low level of 0.5 V (plot 1601) from t6-t10 so that no down coupling of the channel occurs.

In one approach, the time allocated for Vchannel to recover can be omitted so that the time for EV2 can be less than the time for EV1, in one implementation. In another approach, some time can be allocated for pre-charging the channel where this time is less than in EV1. Vsl and Vbl can be provided at Vint as in EV1, if desired, but for a shorter duration. Or, EV2 in this example can follow EV2 in FIG. 14A to 14D, where Vsl and Vbl are kept at 0 V until they are increased to Verase2.

Here, Vsl and Vbl are driven at Vint from t6-t7, increasing Vchannel. Vsl and Vbl are increased from Vint to Verase2 at t7 (plot 1621) causing the channel to be charged up to its peak charged up level. Vchannel follows Vsl and Vbl, but with a delay (plot 1612). Vsgd and Vsgs may be kept low at about 0.5 V from t6-t8 (plot 1635a). Vsgs remains at the low level until t10 (plot 1635c) while Vsgd is allow to float starting at t8 (plot 1635b, where the dotted line denotes floating), when Vsl reaches a specified level. Vsl and Vbl are kept at Verase2 until t10 and then returned to 0 V. A verify test is performed from ts3-ts4.

FIG. 17A depicts a plot of example waveforms in a programming operation, showing coupling up of a word line voltage. As mentioned, the word line voltages may float at a positive level (Vfloat in FIGS. 13A, 14A, 15A and 16A) after a sensing operation, and this level can impact the erase operation. In particular, the amount of channel pre-charging can be configured to be relatively greater in response to detecting that Vfloat is relatively higher.

The time period shown represents one program-verify iteration. The horizontal axis depicts time and the vertical axis depicts word line voltage, Vwl. A program voltage 1700 is applied to a selected word line from t0-t4 and reaches a magnitude of Vpgm. The program voltage can temporarily pause at an intermediate level such as Vpass to avoid a single large transition which can have undesired coupling effects. A pass voltage 1705 is applied to the unselected word lines from t0-t19 and reaches a magnitude of Vpass, which is sufficiently high to provide the cells in a conductive state so that the sensing (e.g., verify) operations can occur for the cells of the selected word line. The pass voltage includes an increasing portion, a fixed amplitude portion, for instance, at Vpass and a decreasing portion. Optionally, the pass voltage may be increased sooner relative to the program voltage so that Vpass is reached by t0.

A verify voltage 1710 is applied to the selected word line. In this example, all seven verify voltages are applied, one after another. An eight-level memory device is used in this example. Verify voltages of VvA, VvB, VvC, VvD, VvE, VvF and VvG are applied at t8, t9, t10, t11, t12, t13 and t14, respectively. The sense circuits may be activated during each verify voltage. The waveform decreases from VvG to 0 V or other steady state level from t15-t16.

For the unselected word lines, the decrease in Vpass will cause the cells to transition from a conductive state to a non-conductive state. In particular, when the Vpass falls below a cutoff level, Vcutoff (the dotted line at t18), the channel of the cell will become cutoff, e.g., the cell will become non-conductive. When a cell becomes non-conductive, it acts as a capacitor in which the control gate is one plate and the channel is another plate. A cell becomes non-conductive when Vcg<Vcutoff or Vcg<(Vth+Vsl), where Vcg is the control gate voltage of the cell (the word line voltage), Vth is the threshold voltage of the cell and Vsl is the source line voltage which in turn is approximately the voltage at the source terminal of the cell. For a cell in the highest programmed state, e.g., the G state, the Vth can be as low as VvG (or lower due to post-programming charge loss) and as high as the Vth at the upper tail of the G state in the Vth distribution 827 in FIG. 7B. Vcutoff can therefore be as low as VvG+Vsl or as high as Vth of G state upper tail+Vsl. As the pass voltage 1705 decreases from Vcutoff to 0 V, the channel is capacitively coupled down by a similar amount, as represented by plot 1715 in FIG. 17B.

The voltage swing while the channel is cutoff will be larger when Vsl is larger. However, since Vch=Vsl, the minimum downcoupled level of Vch will be essentially independent of Vsl. For example, a 6 V swing in the word line voltage (e.g., Vcutoff=6 V) with Vsl=1 V will result in about the same minimum downcoupled level of Vch as a 5 V swing in the word line voltage (e.g., Vcutoff=5 V) with Vsl=0 V.

The plot 1712 represents the coupling up of the word line voltages from t19-t20. The coupling up is depicted as occurring relatively quickly but this is not to scale. In practice, the verify operation, e.g., from t5-t19, may consume about 100 microseconds, while the coupling up of the word line may be significantly longer, in the millisecond range such as 10 milliseconds.

FIG. 17B depicts a plot of a channel voltage (Vch) corresponding to FIG. 17A. For an unselected memory string (a string not having a cell which is programmed in the current program loop), Vch will be boosted to a level such as 8 V (not shown) during the program voltage, e.g., from t0-t4. This boosting is achieved by providing the SGD and SGS transistors of the unselected string in a non-conductive state to cause Vch to float. Vch is coupled higher due to capacitive coupling when Vpass and Vpgm are applied to the word lines. For a selected memory string (a string having a cell which is programmed in the current program loop), Vch is typically grounded as shown during the program voltage.

During the verify voltages, Vch may be initially at about 1 V, for instance, for a selected memory string. Vch is about the same as Vsl for the channels of the selected memory strings. Vsl is set based on a type of sensing which is used. Examples include negative sensing in which Vsl is about 1 V and positive sensing in which Vsl is about 0 V and a negative word line voltage is used. The techniques described herein apply regardless of the level of Vsl or the type of sensing used.

The channel is capacitively coupled down to a minimum level from t18-t19 and then begins to return to a final level of, e.g., 0 V from t19-t20. If the voltages of the word lines are allowed to float starting at t19, the voltages (plot 1712) are capacitively coupled higher by the increase in Vch. The voltages of the word lines float to a level of Vfloat. For example, Vcutoff may be 6 V, so that there is a 6 V change in the word line voltage, e.g., 6-0 V, which is coupled to the channel. With the initial value of Vch at 1 V and a 90% coupling ratio, the minimum Vch may be about 1-6×0.9=-4.4 V, for instance. Accordingly, there is a 4.4 V increase in Vch which is coupled to the word line, e.g., control gate, of the cells. Vfloat may be about 4.4×0.9=4 V. The voltages of the word lines are floated by disconnected the word lines from a word line driver.

FIG. 18A depicts a plot of example waveforms in a read operation, showing coupling up of a word line voltage. A read operation is similar to a verify operation as both are sensing operations and both can provide a coupling up of the word line voltages. The horizontal axis depicts time and the vertical axis depicts word line voltage, Vwl. Pass voltages 1815, 1816 and 1817 are applied to the unselected word lines from t0-t3, t4-t8 and t9-t12, respectively, and have a magnitude of Vpass. The pass voltage includes an increasing portion, a portion at Vpass and a decreasing portion. A read voltage includes separate waveforms 1820 (at levels of VrA and VrE), 1821 (at levels of VrB, VrD and VrF) and 1822 (at levels of VrC and VrG) for each of the lower, middle and upper pages, respectively, consistent with FIG. 7B. The read voltages are applied to the selected word line. An eight-level memory device is used in this example.

For the unselected word lines, the decrease in Vpass will cause the cells to transition from a conductive state to a non-conductive state, as discussed. The dotted line at t13 indicates when a G state cell becomes non-conductive. As the pass voltage 1817 decreases from Vcutoff to 0 V, the channel is capacitively coupled down by a similar amount, as represented by the plot 1835 in FIG. 18B. As the channel voltage increases after t14, the word line voltages are floated and are coupled higher, to Vfloat.

FIG. 18B depicts a plot of a channel voltage (Vch) corresponding to FIG. 18A. The channel is capacitively coupled down to a minimum level of Vch min from t13-t14 and then begins to return to a final level of, e.g., 0 V from t14-t15. If the voltages of the word lines are allowed to float starting at t14, the voltages (plot 1832) are capacitively coupled higher by the increase in Vch (plot 1835). The voltages of the word lines float to a level of Vfloat, as discussed.

Once the word line voltages reach Vfloat, they will gradually decay over time, e.g., over several minutes, hours or days.

Figure 19A:
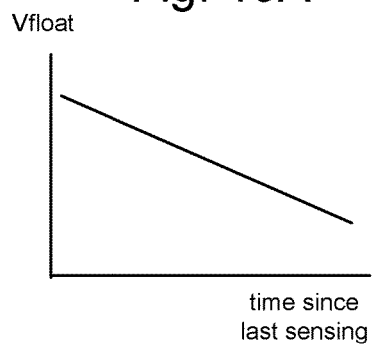
FIG. 19A depicts a plot of Vfloat versus a time since a last sensing.

FIG. 19A depicts a plot of Vfloat versus a time since a last sensing. Vfloat is at a peak level after a sensing operation and then decreases as the time since the last sensing operation increases.

Figure 19D:
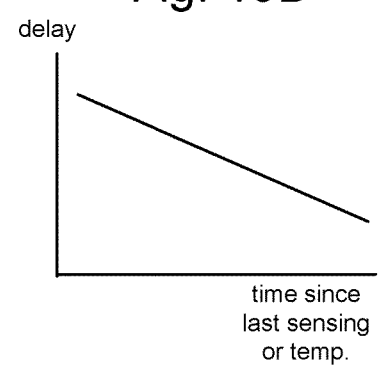
FIG. 19D depicts a plot of a delay during pre-charge versus a time since a last sensing or a temperature.
Figure 19B:
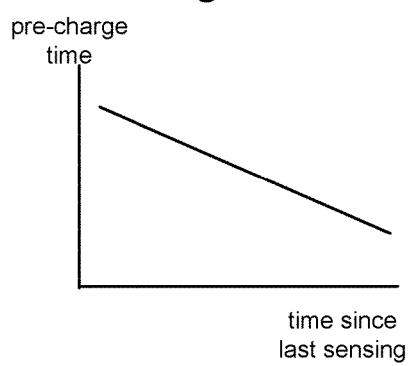
FIG. 19B depicts a plot of a pre-charge time versus a time since a last sensing.

FIG. 19B depicts a plot of a pre-charge time versus a time since a last sensing. The pre-charge time can be made shorter when the time since the last sensing operation is greater. This is because Vchannel will be greater (less negative) when Vfloat is less, and a smaller Vfloat is associated with a larger time since the last sensing operation.

Figure 19E:
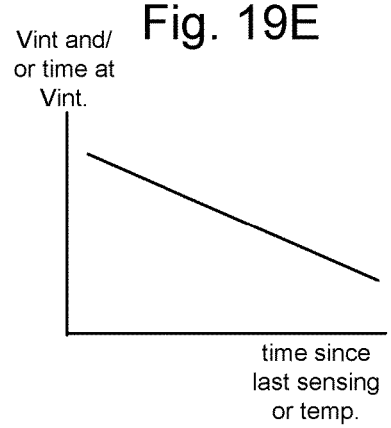
FIG. 19E depicts a plot of Vint or a duration of Vint during pre-charge versus a time since a last sensing or a temperature.
Figure 19C:
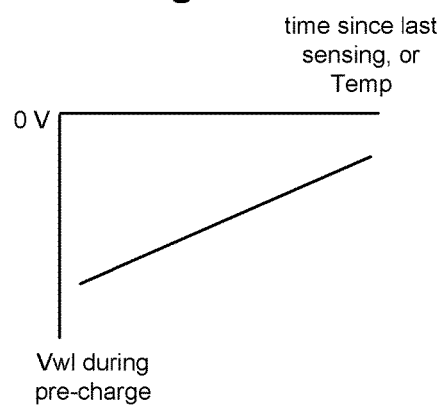
FIG. 19C depicts a plot of Vwl during pre-charge versus a time since a last sensing or a temperature.

FIG. 19C depicts a plot of Vwl during pre-charge versus a time since a last sensing or a temperature. Vwl can be made greater (less negative) when the time since the last sensing operation is greater (and Vfloat is less). Also, Vwl can be made greater (less negative) when the temperature is greater because. Disturb is reduced at higher temperatures (FIGS. 10A and 10B) so that the negative Vwl can be less severe.

FIG. 19D depicts a plot of a delay during pre-charge versus a time since a last sensing or a temperature. In one approach, the delay is between when the control gate voltages are driven from the current level to the lower level and when the control gate voltages are driven from the lower level to the higher level, is a function of an elapsed time since a last sensing operation involving the set of memory cells, and is relatively shorter when the elapsed time is relatively greater.

In another approach, the delay is between when the control gate voltages are driven from the current level to the lower level and when the control gate voltages are driven from the lower level to the higher level, is a function of a temperature and is relatively shorter when the temperature is relatively greater.

In another approach, the delay is between when the control gate voltages are driven from the current level to the lower level and when the voltage at the source end is driven higher to the erase level is a function of a temperature, and is relatively shorter when the temperature greater.

FIG. 19E depicts a plot of Vint or a duration of Vint during pre-charge versus a time since a last sensing or a temperature. In one approach, the intermediate level is a function of a temperature and is relatively lower when the temperature is relatively greater. In another approach, the intermediate level is a function of an elapsed time since a last sensing operation involving the set of memory cells and is relatively lower when the elapsed time is relatively greater. In another approach, a time period in which the voltage at the source end is held at the intermediate level is a function of an elapsed time since a last sensing operation involving the set of memory cells, and is relatively shorter when the elapsed time is relatively greater. In another approach, a time period in which the voltage at the source end is held at the intermediate level is a function of a temperature and is relatively shorter when the temperature is relatively greater.

Figure 20:
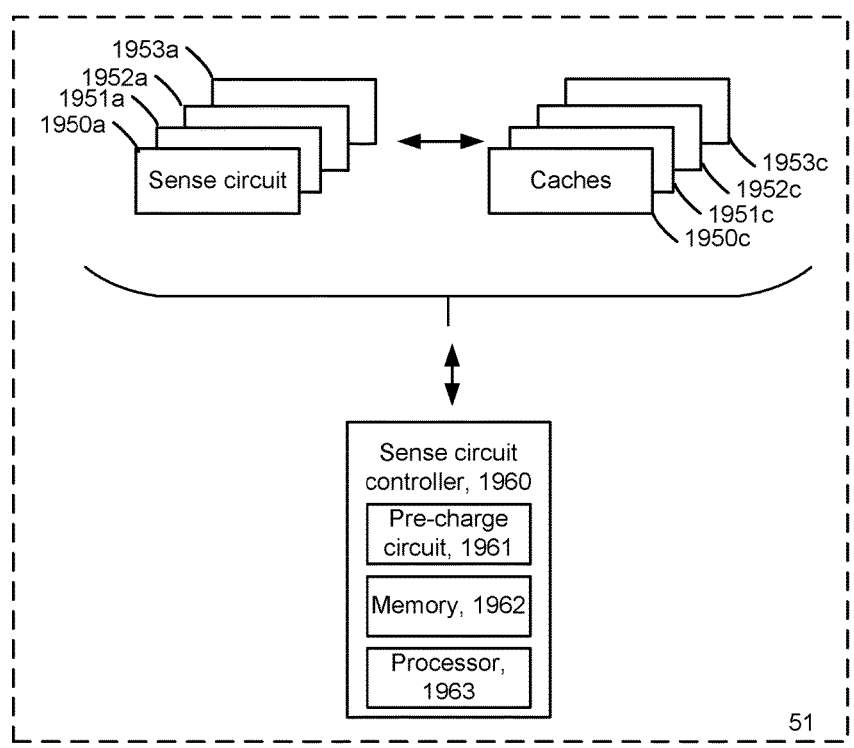
FIG. 20 depicts an example block diagram of a sense block 51 in the column control circuitry of FIG. 1A.

FIG. 20 depicts an example block diagram of a sense block 51 in the column control circuitry of FIG. 1A. The column control circuitry can include multiple sense blocks, where each sense block performs sensing, e.g., read, program-verify or erase-verify operations for multiple memory cells via respective bit lines.

In one approach, a sense block comprises multiple sense circuits, also referred to as sense amplifiers. Each sense circuit is associated with data latches and caches. For example, the example sense circuits 1950a, 1951a, 1952a and 1953a are associated with caches 1950c, 1951c, 1952c and 1953c, respectively.

In one approach, different subsets of bit lines can be sensed using different respective sense blocks. This allows the processing load which is associated with the sense circuits to be divided up and handled by a respective processor in each sense block. For example, a sense circuit controller 1960 can communicate with the set, e.g., sixteen, of sense circuits and latches. The sense circuit controller may include a pre-charge circuit 1961 which provides a voltage to each sense circuit for setting a pre-charge voltage. The sense circuit controller may also include a memory 1962 and a processor 1963.

Further example details of the sense circuit controller and the sense circuits are provided below.

Figure 21:
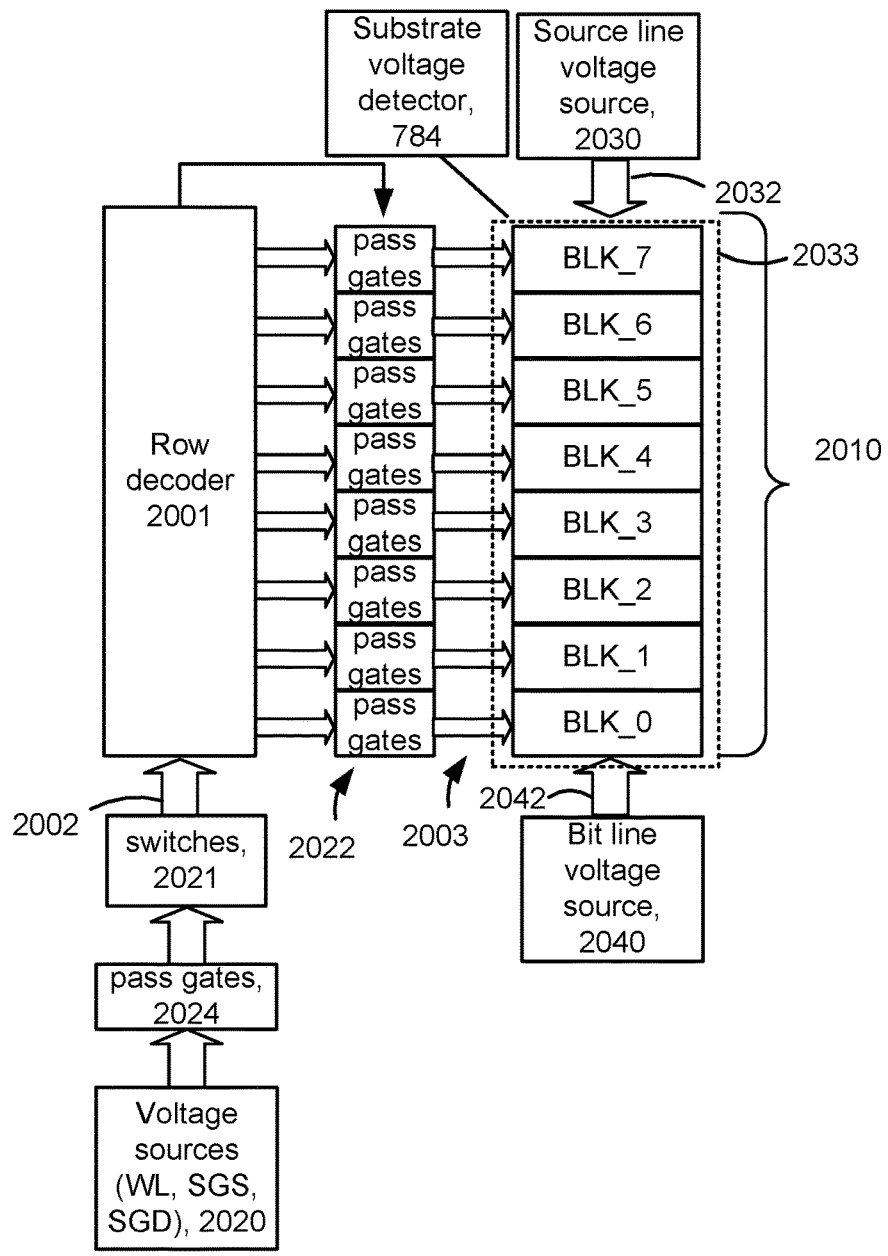
FIG. 21 depicts an example circuit for providing voltages to blocks of memory cells.

FIG. 21 depicts an example circuit for providing voltages to blocks of memory cells. In this example, a row decoder 2001 provides voltages to word lines and select gates of each block in set of blocks 2010. The set could be in a plane and includes blocks BLK0 to BLK7, for instance. The row decoder provides a control signal to pass gates 2022 which connect the blocks to the row decoder. Typically, operations, e.g., program, read or erase, are performed on one selected block at a time. The row decoder can connect global control lines 2002 to local control lines 2003. The control lines represent conductive paths. Voltages are provided on the global control lines from voltage sources 2020. The voltage sources may provide voltages to switches 2021 which connect to the global control lines. Pass gates 2024, also referred to as pass transistors or transfer transistors, are controlled to pass voltages from the voltage sources 2020 to the switches 2021.

The voltage sources 2020 can provided voltages on data and dummy word lines (WL) and dummy word line portions, SGS layers and SGD layer portions, for example.

The various components, including the row decoder, may receive commands from a controller such as the state machine 112 or the controller 122 to perform the functions described herein.

A source line voltage source 2030 provides a voltage to the source lines/diffusion region in the substrate via control lines 2032. In one approach, the source diffusion region 2033 is common to the blocks. A set of bit lines 2042 is also shared by the blocks. A bit line voltage source 2040 provides voltages to the bit lines. In one possible implementation, the voltage sources 2020 are near the bit line voltage source.

A substrate voltage detector 784 consistent with FIG. 6C is connected to the diffusion region 2033.

In one embodiment, an apparatus comprises: a memory string comprising a set of memory cells between a source end of the memory string and a drain end of the memory string, wherein the drain end comprises a select gate transistor, and a channel extends between the source end and the drain end; and a control circuit. The control circuit, to perform an erase operation for the set of memory cells, is configured to: drive control gate voltages of the memory cells at a lower level, below a current level, to down couple a voltage in the channel to a negative down coupled voltage; increase the voltage in the channel from the negative down coupled voltage to a positive voltage; when the voltage in the channel is at the positive voltage, drive a voltage at the source end higher to an erase level which charges up the channel to a peak charged up level; and hold the control gate voltages of the memory cells at a fixed level which erases the memory cells while the channel is at the peak charged up level.

In another embodiment, a method for erasing memory cells comprises, in one erase loop of a plurality of erase loops of an erase operation: down coupling a voltage in a channel of a memory string, the memory string comprising a set of memory cells between a source end of the memory string and a drain end of the memory string, wherein the drain end comprises a select gate transistor, the channel extends between the source end and the drain end; and after the down coupling, charging the channel to a positive voltage before driving a voltage at the source end higher to an erase level which charges up the channel from the positive voltage to an erase voltage.

In one approach, the one erase loop is a first erase loop in the plurality of erase loops, and the method further comprises, in a subsequent erase loop of the plurality of erase loops: charging the channel to a positive voltage before driving the voltage at the source end higher to an erase level, wherein a reduced time period (e.g., t7-t6 in FIGS. 14B, 15B and 16C) is allocated to the charging of the channel in the subsequent erase loop than in the first erase loop (e.g., t2-t1 in FIGS. 14B, 15B and 16C).

In another embodiment, an apparatus comprises: a memory string comprising a set of memory cells between a source end of the memory string and a drain end of the memory string, wherein the drain end comprises a select gate transistor, and a channel extends between the source end and the drain end; means for down coupling a voltage in the channel; means for charging the channel to a positive voltage after the down coupling; and means for charging the channel from the positive voltage to an erase voltage which is greater than the positive voltage.

The means described above can include the components of the memory device 100 of FIG. 1 and FIG. 2, for example. The power control module 116, for instance, controls the power and voltages supplied to the word lines, select gate lines and bit lines during memory operations. Moreover, the means described above can include the components of FIG. 21 including the decoders, voltage drivers, switches and pass transistors. The means can further include any of the control circuits in FIG. 1A such as the control circuitry 110 and controller 122.

The foregoing detailed description of the invention has been presented for purposes of illustration and description. It is not intended to be exhaustive or to limit the invention to the precise form disclosed. Many modifications and variations are possible in light of the above teachings. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

We claim:

1. An apparatus, comprising:
   a memory string comprising a set of memory cells between a source end of the memory string and a drain end of the memory string, wherein the drain end comprises a select gate transistor, and a channel extends between the source end and the drain end; and
   a control circuit, the control circuit, to perform an erase operation for the set of memory cells, is configured to:
   drive control gate voltages of the memory cells at a lower level, below a current level, to down couple a voltage in the channel to a negative down coupled voltage;
   increase the voltage in the channel from the negative down coupled voltage to a positive voltage;
   when the voltage in the channel is at the positive voltage, drive a voltage at the source end higher to an erase level which charges up the channel to a peak charged up level; and
   hold the control gate voltages of the memory cells at a fixed level which erases the memory cells while the channel is at the peak charged up level, wherein the control circuit, to increase the voltage in the channel from the negative down coupled voltage to the positive voltage, is configured to drive the voltage at the source end from an initial level to an intermediate level, below the erase level, after the control gate voltages are driven from the current level to the lower level, and the voltage at the source end is held at the intermediate level and then driven higher from the intermediate level to the erase level.

2. The apparatus of claim 1, wherein:
   the intermediate level is a function of a temperature and is relatively lower when the temperature is relatively greater.

3. The apparatus of claim 1, wherein:
   the intermediate level is a function of an elapsed time since a last sensing operation involving the set of memory cells and is relatively lower when the elapsed time is relatively greater.

4. The apparatus of claim 1, wherein:
   the current level is a floating level; and
   a time period in which the voltage at the source end is held at the intermediate level is a function of an elapsed time since a last sensing operation involving the set of memory cells, and is relatively shorter when the elapsed time is relatively greater.

5. The apparatus of claim 1, wherein:
   the current level is a floating level; and
   a time period in which the voltage at the source end is held at the intermediate level is a function of a temperature and is relatively shorter when the temperature is relatively greater.

6. The apparatus of claim 1, wherein:
   a delay between when the control gate voltages are driven from the current level to the lower level and when the voltage at the source end is driven higher to the erase level is a function of a temperature, and is relatively shorter when the temperature greater.

7. A method for erasing memory cells, comprising, in one erase loop of a plurality of erase loops of an erase operation:
- down coupling a voltage in a channel of a memory string, the memory string comprising a set of memory cells between a source end of the memory string and a drain end of the memory string, wherein the drain end comprises a select gate transistor, the channel extends between the source end and the drain end; and
- after the down coupling, charging the channel to a positive voltage before driving a voltage at the source end higher to an erase level which charges up the channel from the positive voltage to an erase voltage, the charging comprises driving the voltage at the source end from an initial level to an intermediate level, below the erase level, holding the voltage at the source end at the intermediate level and then driving the voltage at the source end from the intermediate level to the erase level.

8. The method of claim 7, wherein the one erase loop is a first erase loop in the plurality of erase loops, the method further comprising, in a subsequent erase loop of the plurality of erase loops:
- charging the channel to a positive voltage before driving the voltage at the source end higher to an erase level, wherein a reduced time period is allocated to the charging of the channel in the subsequent erase loop than in the first erase loop.

9. The method of claim 7, wherein:
- the down coupling comprises driving control gate voltages of the memory cells at a negative level, below a current level; and
- the charging comprises driving the control gate voltages of the memory cells from the negative level to a higher level to up couple the voltage in the channel.

10. An apparatus, comprising:
- a memory string comprising a set of memory cells between a source end of the memory string and a drain end of the memory string, wherein the drain end comprises a select gate transistor, and a channel extends between the source end and the drain end;
- means for down coupling a voltage in the channel, wherein the means for down coupling comprises means for driving control gate voltages of the memory cells at a lower level, below a current level;
- means for charging the channel to a positive voltage after the down coupling; and
- means for charging the channel from the positive voltage to an erase voltage which is greater than the positive voltage, wherein the means for charging comprises means for driving the control gate voltages of the memory cells from the lower level to a higher level to up couple the voltage in the channel.

11. The apparatus of claim 10, wherein:
the means for charging comprises means for driving the voltage at the source from an initial level to an intermediate level, below the erase voltage, holding the voltage at the source end at the intermediate level and then driving the voltage at the source end higher from the intermediate level to the erase voltage.

12. The apparatus of claim 10, wherein:
the voltage in the channel is down coupled to a negative voltage.

13. The apparatus of claim 10, wherein:
the means for charging the channel to a positive voltage drives the control gate voltages of the memory cells from the lower level to a higher level to up couple the voltage in the channel.

14. The apparatus of claim 10, further comprising:
means for driving a voltage at the source end to an erase voltage, wherein the means for driving the control gate voltages of the memory cells drives the control gate voltages of the memory cells from the lower level to the higher level during the driving of the voltage at the source end to an erase voltage.

15. The apparatus of claim 10, wherein:
the lower level is a negative level.

16. The apparatus of claim 15, wherein:
the current level is a floating level; and
the negative level is a function of an elapsed time since a last sensing operation involving the set of memory cells and is relatively higher when the elapsed time is relatively greater.

17. The apparatus of claim 15, wherein:
the negative level is a function of a temperature and is relatively higher when the temperature is relatively greater.

18. The apparatus of claim 10, wherein:
the current level is a floating level; and
a delay between when the control gate voltages are driven from the current level to the lower level and when the control gate voltages are driven from the lower level to the higher level is a function of an elapsed time since a last sensing operation involving the set of memory cells, and is relatively shorter when the elapsed time is relatively greater.

19. The apparatus of claim 10, wherein:
a delay between when the control gate voltages are driven from the current level to the lower level and when the control gate voltages are driven from the lower level to the higher level is a function of a temperature and is relatively shorter when the temperature is relatively greater.

* * * * *